(12) United States Patent
Ryu et al.

(10) Patent No.: US 11,798,926 B2
(45) Date of Patent: Oct. 24, 2023

(54) DISPLAY DEVICE

(71) Applicant: Samsung Display Co., LTD., Yongin-si (KR)

(72) Inventors: An Na Ryu, Hwaseong-si (KR); Jin Oh Kwag, Yongin-si (KR); Dae Hyun Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 297 days.

(21) Appl. No.: 17/364,042

(22) Filed: Jun. 30, 2021

(65) Prior Publication Data

US 2022/0005797 A1 Jan. 6, 2022

(30) Foreign Application Priority Data

Jul. 2, 2020 (KR) .......................... 10-2020-0081565

(51) Int. Cl.
*H01L 25/16* (2023.01)
*H01L 27/12* (2006.01)
(Continued)

(52) U.S. Cl.
CPC ........ *H01L 25/167* (2013.01); *H01L 27/1248* (2013.01); *H01L 33/62* (2013.01); *H01L 33/507* (2013.01); *H01L 2933/0091* (2013.01)

(58) Field of Classification Search
CPC ... H01L 25/167; H01L 27/1248; H01L 33/62; H01L 33/507; H01L 2933/0091; H01L 25/0753; H01L 27/1214; H01L 33/38
See application file for complete search history.

(56) References Cited

U.S. PATENT DOCUMENTS 10,797,212 B2   10/2020   Im et al.
11,152,424 B2   10/2021   Li et al.
(Continued)

FOREIGN PATENT DOCUMENTS

KR   10-2018-0011404   2/2018
KR   10-2018-0082667   7/2018
(Continued)

OTHER PUBLICATIONS

International Search Report corresponding to International Application No. PCT/KR2021/008282 dated Oct. 12, 2021.
(Continued)

*Primary Examiner* — Victor A Mandala
(74) *Attorney, Agent, or Firm* — KILE PARK REED & HOUTTEMAN PLLC

(57) ABSTRACT

A display device comprises a first substrate, a conductive layer including a first electrode on the first substrate, an interlayer insulating layer on the conductive layer, a via layer on the interlayer insulating layer and including a hole exposing a part of a top surface of the interlayer insulating layer, a second electrode spaced apart from the hole and on the via layer, light emitting elements inside the hole of the via layer, a first contact electrode electrically connected to the first electrode and a first end of the light emitting elements, and a second contact electrode on the via layer and electrically connected to a second end of the light emitting elements. At least a part of the light emitting elements are placed on an inner wall of the hole.

20 Claims, 20 Drawing Sheets

(51) Int. Cl.
  *H01L 33/62* (2010.01)
  *H01L 33/50* (2010.01)

(56) References Cited

U.S. PATENT DOCUMENTS

| | | | |
|---|---|---|---|
| 2004/0149995 A1* | 8/2004 | Shoji | H01L 31/16 257/E31.103 |
| 2017/0269749 A1 | 9/2017 | Bok et al. | |
| 2018/0019369 A1* | 1/2018 | Cho | H05K 1/11 |
| 2018/0358403 A1* | 12/2018 | Oh | H01L 27/156 |
| 2021/0020819 A1* | 1/2021 | Im | H01L 33/62 |
| 2021/0272937 A1 | 9/2021 | Lim et al. | |
| 2021/0399040 A1* | 12/2021 | Chai | H01L 33/38 |

FOREIGN PATENT DOCUMENTS

| | | | |
|---|---|---|---|
| KR | 10-20180082667 | * | 7/2018 |
| KR | 10-2019-0042130 | | 4/2019 |
| KR | 10-2019-0096474 | | 8/2019 |
| KR | 10-2020-0006651 | | 1/2020 |
| KR | 10-2020-0014955 | | 2/2020 |

OTHER PUBLICATIONS

Written Opinion corresponding to International Application No. PCT/KR2021/008282 dated Oct. 12, 2021.

* cited by examiner

DISPLAY DEVICE

CROSS-REFERENCE TO RELATED APPLICATION(S)

This application claims priority to and benefits of Korean Patent Application No. 10-2020-0081565 under 35 U.S.C. § 119, filed on Jul. 2, 2020 in the Korean Intellectual Property Office, the entire contents of which are herein incorporated by reference.

BACKGROUND

1. Technical Field

The disclosure relates to a display device.

2. Description of the Related Art

The importance of display devices has steadily increased with the development of multimedia technology. Accordingly, various types of display devices such as an organic light emitting display (OLED), a liquid crystal display (LCD) and the like have been used.

A display device is a device for displaying an image, and may include a display panel, such as an organic light emitting display panel or a liquid crystal display panel. Among display panels, a light emitting display panel may include light emitting elements, e.g., light emitting diodes (LED). Examples of the light emitting diode may include an organic light emitting diode (OLED) using an organic material as a fluorescent material and an inorganic light emitting diode using an inorganic material as a fluorescent material.

SUMMARY

Aspects of the disclosure provide an inorganic light emitting diode display device having a novel electrode structure that may be capable of improving light emission efficiency.

However, aspects of the disclosure are not restricted to the one set forth herein. The above and other aspects of the disclosure will become more apparent to one of ordinary skill in the art to which the disclosure pertains by referencing the detailed description of the disclosure given below.

The display device according to an embodiment may be capable of enabling light emitting elements to be aligned in an obliquely erected state by using electrodes disposed on different layers and a via layer including holes or certain structures. In the display device, since the light emitting elements may be disposed in an erected state, most of the light emitted from ends of the light emitting element may be emitted upward. This may render possible improvement of the light emission efficiency of each sub-pixel of the display device.

The effects of the disclosure are not limited to the aforementioned effects, and various other effects are included in the specification.

According to an embodiment of the disclosure, a display device may comprise a first substrate, a conductive layer including a first electrode disposed on the first substrate, an interlayer insulating layer disposed on the conductive layer, a via layer disposed on the interlayer insulating layer and including a hole exposing a part of a top surface of the interlayer insulating layer, a second electrode spaced apart from the hole and disposed on the via layer, light emitting elements disposed inside the hole of the via layer, a first contact electrode electrically connected to the first electrode and a first end of the light emitting elements, and a second contact electrode disposed on the via layer and electrically connected to a second end of the light emitting elements, wherein at least a part of the light emitting elements may be placed on an inner wall of the hole, and a direction in which a longitudinal axis of the light emitting elements extends may be inclined not to be parallel with a top surface of the first substrate.

The second electrode may be disposed not to overlap the first electrode in a thickness direction, the first contact electrode may be disposed on the via layer, at least a part of the first contact electrode may be disposed on the inner wall of the hole, and the first contact electrode may be electrically connected to the first end of the light emitting elements.

The display device may further comprise a first insulating layer disposed to overlap a portion of the light emitting elements, the first contact electrode, and the second electrode, wherein the second contact electrode may be disposed directly on the first insulating layer to directly contact the second end of the light emitting elements which stick out from the first insulating layer.

The conductive layer may include a first voltage wiring disposed to overlap the second electrode in a thickness direction, and a conductive pattern spaced apart from the first voltage wiring, and the second electrode may be directly connected to the first voltage wiring through a contact hole penetrating the via layer without being connected to the second contact electrode.

The first contact electrode may be directly connected to the first electrode through a contact hole penetrating the via layer and the interlayer insulating layer, and the second contact electrode may be directly connected to the conductive pattern through a contact hole penetrating the first insulating layer, the via layer, and the interlayer insulating layer.

A width of the hole may be smaller than a length of the light emitting elements.

The first electrode may be disposed to overlap the hole in a thickness direction, the first contact electrode may be disposed inside the hole to be directly connected to the first electrode, and the first end of the light emitting elements may be disposed on the first contact electrode.

The second electrode may be provided in plural such that a plurality of the second electrodes may be spaced apart from each other with the hole therebetween, and each of the second electrodes may do not overlap the first electrode in a thickness direction.

The light emitting elements may include a first light emitting element having the second end disposed toward one of the second electrodes and placed on a side of the inner wall of the hole, and a second light emitting element having the second end disposed toward another one of the second electrodes and placed on another side of the inner wall of the hole.

The second contact electrode may be provided in plural such that a plurality of the second contact electrodes may be disposed to respectively contact the second electrodes, and each of the second contact electrodes may be in contact with a second end of the first light emitting element and a second end of the second light emitting element.

The display device may further comprise a first insulating layer disposed to fill the hole and surrounding outer surfaces of the light emitting elements.

The display device may further comprise wavelength conversion particles and scattering particles disposed in the first insulating layer, wherein the wavelength conversion particles may convert a wavelength of light emitted from the light emitting elements.

The conductive layer may include floating electrodes overlapping the hole in a thickness direction and spaced apart from each other, and the first electrode may be provided in plural such that a plurality of the first electrodes may be spaced apart from each other and the floating electrodes are disposed between the first electrodes, and the first contact electrode may be disposed to overlap the floating electrodes in a thickness direction inside the hole.

The interlayer insulating layer may include a pattern of protrusions formed at a portion overlapping the floating electrodes and protruding correspond to the floating electrodes, and the first contact electrode may include a prominence or depression pattern formed at a portion overlapping the pattern of the protrusions.

The second electrode may be provided in plural such that a plurality of the second electrodes may be spaced apart from each other and the hole may be disposed between the second electrodes, and each of the second electrodes may overlap the first electrode in a thickness direction.

According to an embodiment of the disclosure, a display device may comprise a first substrate, first electrodes disposed on the first substrate and spaced apart from each other, a first contact electrode disposed between the first electrodes, the first contact electrode and the first electrodes may be disposed on a same player, structures disposed to respectively overlap the first electrodes, second electrodes respectively disposed on the structures to overlap the first electrodes in a thickness direction, light emitting elements disposed between the structures such that first ends of the light emitting elements are disposed on the first contact electrode and second ends of the light emitting elements are disposed on side surfaces of the structures, and second contact electrodes electrically connected to the second ends of the light emitting elements and the second electrodes, wherein the light emitting element may be disposed such that a direction in which a longitudinal axis of the light emitting elements extends may be inclined not to be parallel with a top surface of the first substrate.

A width of each of the structures may be greater than a width of the first electrode, and the first contact electrode may be disposed between the structures.

The light emitting elements may include a first light emitting element disposed such that the second end is disposed on one of the structures, and a second light emitting element disposed such that the second end is disposed on another one of the structures, and the second ends of the first and second light emitting elements may face different directions.

The second contact electrodes may be spaced apart from each other to contact the second end of the first light emitting element or the second end of the second light emitting element, and the second contact electrodes may directly contact the second electrodes.

The display device may further comprise a first insulating layer disposed on the first contact electrode between the structures to partially surround outer surfaces of the light emitting elements.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
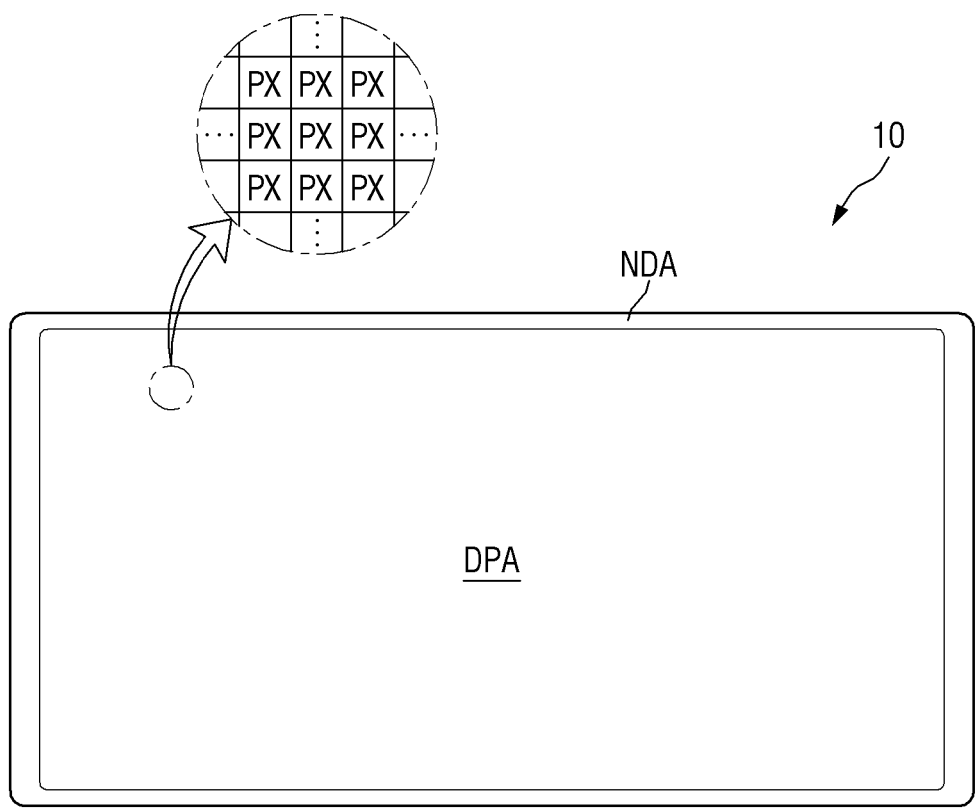
FIG. 1 is a schematic plan view of a display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

When a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The term "connection" may refer to an indirect connection between two elements via another element as well as a direct connection between the two elements in physical contact with each other. This may also be understood as one part and the other part as integral elements are connected into an integrated element via another element. Furthermore, if one element is connected to another element, this may be construed as a meaning including an electrical connection via another element in addition to a direct connection in physical contact.

Elements expressed in singular form or plural form should not be limited to any specific number requirement. For example, in the case of using a singular form for expressing inclusion of an element, the singular form is intended to include the plural form as well unless the context clearly indicates otherwise, and in the case of using a plural form for expressing inclusion of multiple elements, the plural form is intended to include the singular form as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The term "overlap" may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

"About", "approximately" or "substantially" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view of a display device according to an embodiment.

Referring to FIG. 1, a display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel may be applied as a display panel will be exemplified, but the disclosure is not limited thereto. Embodiments including other display panels should be considered to be within the scope of the disclosure.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. In FIG. 1, the display device 10 and the display area DPA having a rectangular shape elongated in the horizontal direction are illustrated.

The display device 10 may include a display area DPA and a non-display area NDA. The display area DPA may be an area where a screen can be displayed, and the non-display area NDA may be an area where a screen may not be displayed. The display area DPA may also be referred to as an active region, and the non-display area NDA may also be referred to as a non-active region. The display area DPA may substantially occupy the center of the display device 10.

The display area DPA may include pixels PX. The pixels PX may be disposed in a matrix. The shape of each pixel PX may be a rectangular or square shape in plan view. However, the disclosure is not limited thereto, and it may be a rhombic shape in which each side may be inclined with respect to one direction. The pixels PX may be alternately disposed in a stripe arrangement or a pentile arrangement. Each of the pixels PX may include one or more light emitting elements ED that emit light of a specific wavelength band to display a specific color.

The non-display area NDA may be disposed adjacent to (e.g., around) the display area DPA. The non-display area NDA may completely or partially surround the display area DPA. The display area DPA may have a rectangular shape, and the non-display area NDA may be disposed adjacent to sides of the display area DPA. The non-display area NDA may form a bezel of the display device 10. Wirings or circuit drivers included in the display device 10 may be disposed in the non-display area NDA, or external devices may be mounted thereon.

Figure 2:
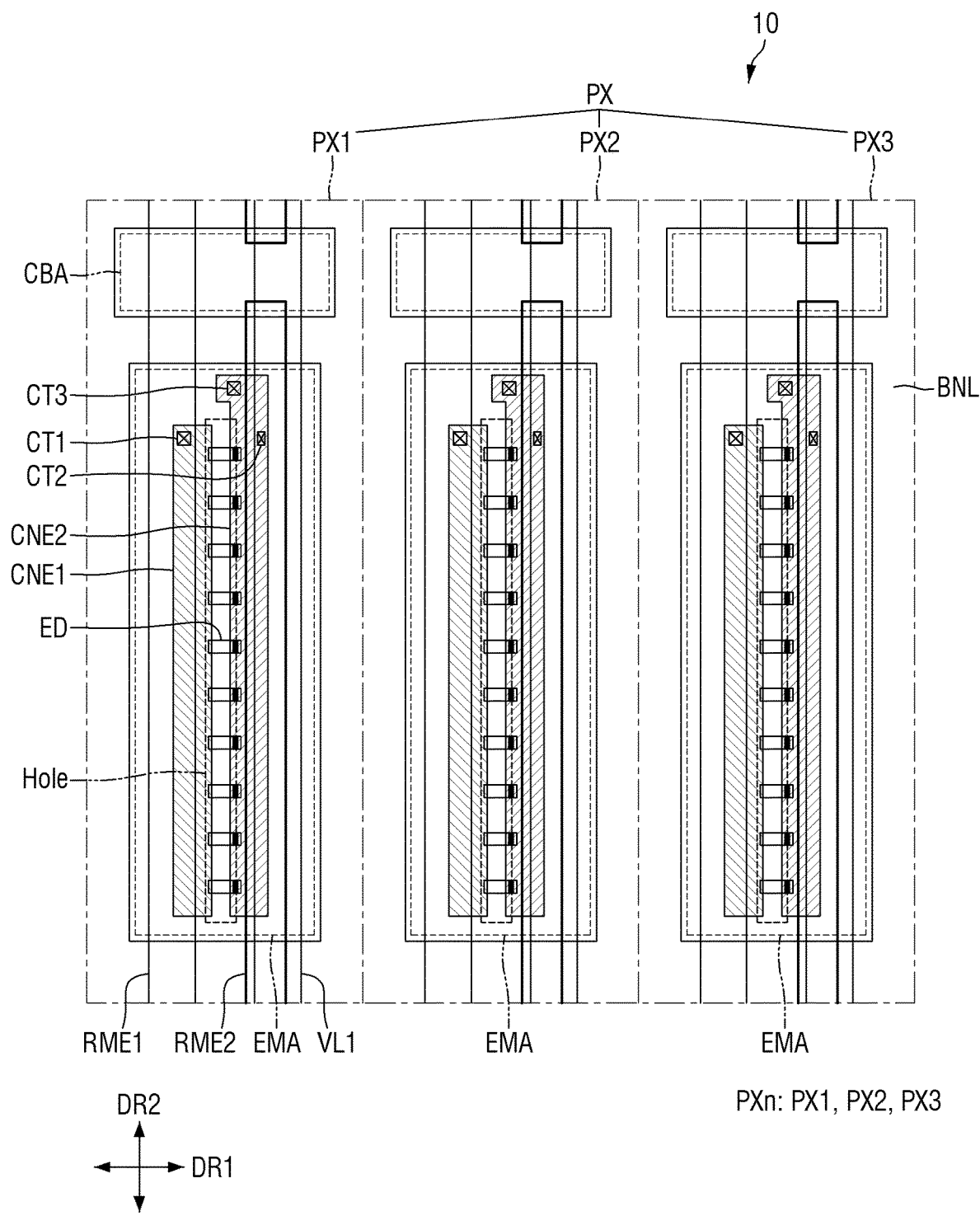
FIG. 2 is a schematic plan view illustrating one pixel of a display device according to an embodiment.

FIG. 2 is a schematic plan view illustrating one pixel of a display device according to an embodiment.

Referring to FIG. 2, each of the pixels PX may include sub-pixels PXn (n may be an integer of 1 to 3). For example, one pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the disclosure is not limited thereto, and the sub-pixels PXn may emit light of the same color. Although FIG. 2 illustrates that the pixel PX includes three sub-pixels PXn, the disclosure is not limited thereto, and the pixel PX may include a larger number of sub-pixels PXn.

Each sub-pixel PXn of the display device 10 may include an emission area EMA and a non-emission area (not shown). The emission area EMA may be an area where the light emitting elements ED may be aligned to emit light of a certain wavelength band. The non-emission area may be an area where there may be no light emitting element ED and the light emitted from the light emitting elements ED do not reach, so that no light may be emitted. The emission area may further include an area adjacent to the light emitting elements ED, where the light emitted from the light emitting elements ED reaches, in addition to the area in which the light emitting elements ED may be aligned.

Without being limited thereto, the emission area may also include an area in which the light emitted from the light emitting elements ED may be reflected or refracted by another member and emitted. The light emitting elements ED may be disposed in each sub-pixel PXn, and the emission area may be formed to include an area where the light emitting elements ED may be disposed and an area adjacent thereto.

Although it is shown in the drawing that the sub-pixels PXn have the emission areas EMA that may be substantially identical in size, the disclosure is not limited thereto. In some embodiments, the emission areas EMA of the first to third sub-pixels PX1, PX2, and PX3 may differ in size according to the colors or wavelength bands of the light emitted from the light emitting elements ED aligned in the corresponding sub-pixel.

The sub-pixels PXn may each include a cutout area CBA disposed in the non-emission area. The cutout area CBA may be disposed on one side of the emission area EMA in a second direction DR2. The cutout area CBA may be disposed between the emission areas EMA of the sub-pixels PXn adjacent in the second direction DR2. For example, emission areas EMA and cutout areas CBA may be arranged in the display area DPA of the display device 10. For example, the emission areas EMA and the cutout areas CBA may each be repeatedly disposed in a first direction DR1 and alternately disposed in the second direction DR2. A bank BNL may be disposed between the cutout areas CBA and between the emission areas EMA, and the distance therebetween may vary with the width of the bank BNL. The cutout areas CBA may have no light emitting elements ED aligned therein and thus emit no light. However, second electrodes RME2 disposed in the sub-pixels PXn may be partially disposed in the cutout areas CBA. The second electrodes RME2 disposed in some sub-pixels PXn may be arranged separately from each other in the cutout areas CBA. However, the disclosure is not limited thereto, and the second electrodes RME2 may be disposed in the state of not being separated from each other in the cutout areas CBA.

Figure 3:
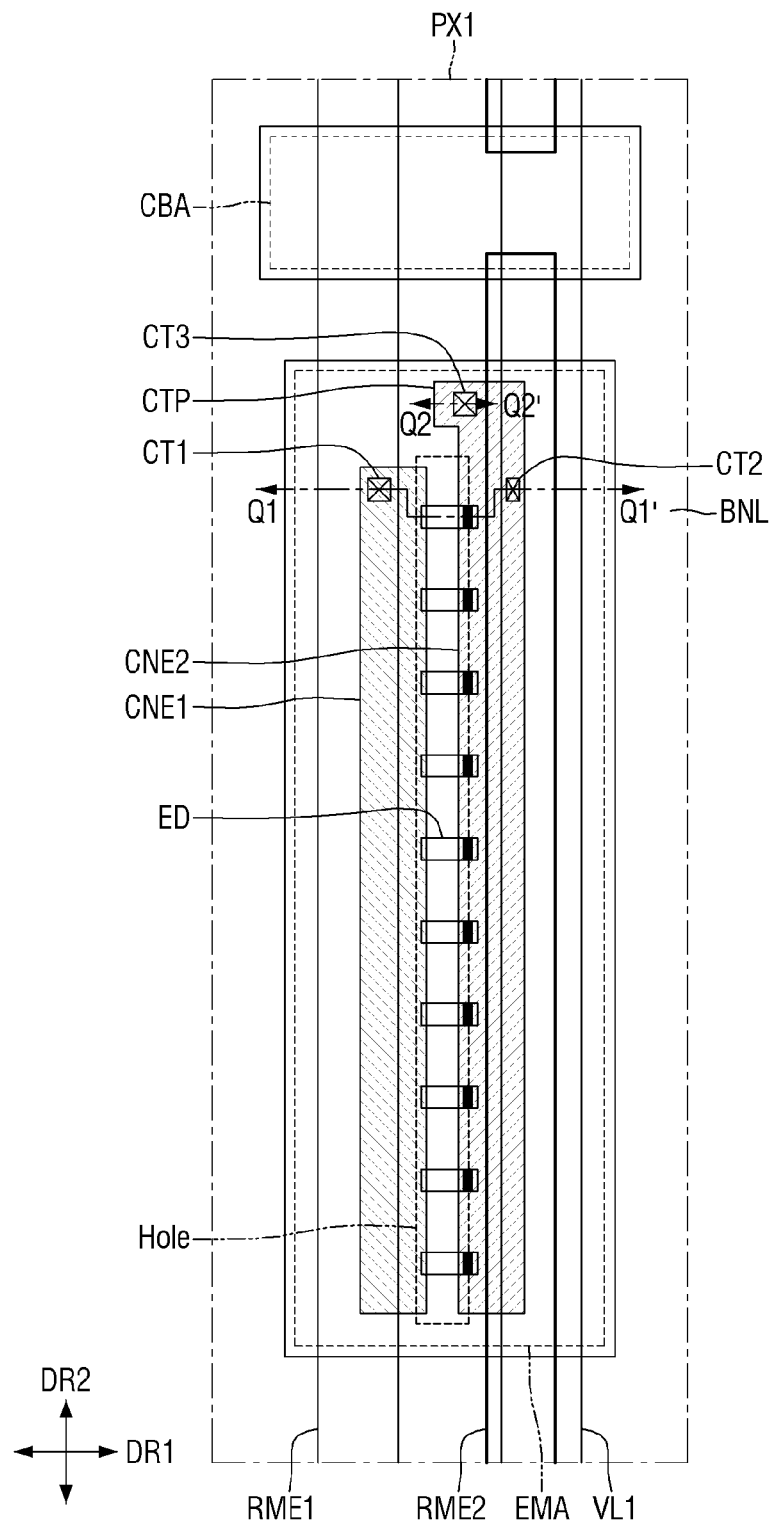
FIG. 3 is a schematic plan view illustrating a first sub-pixel of FIG. 2.
Figure 4:
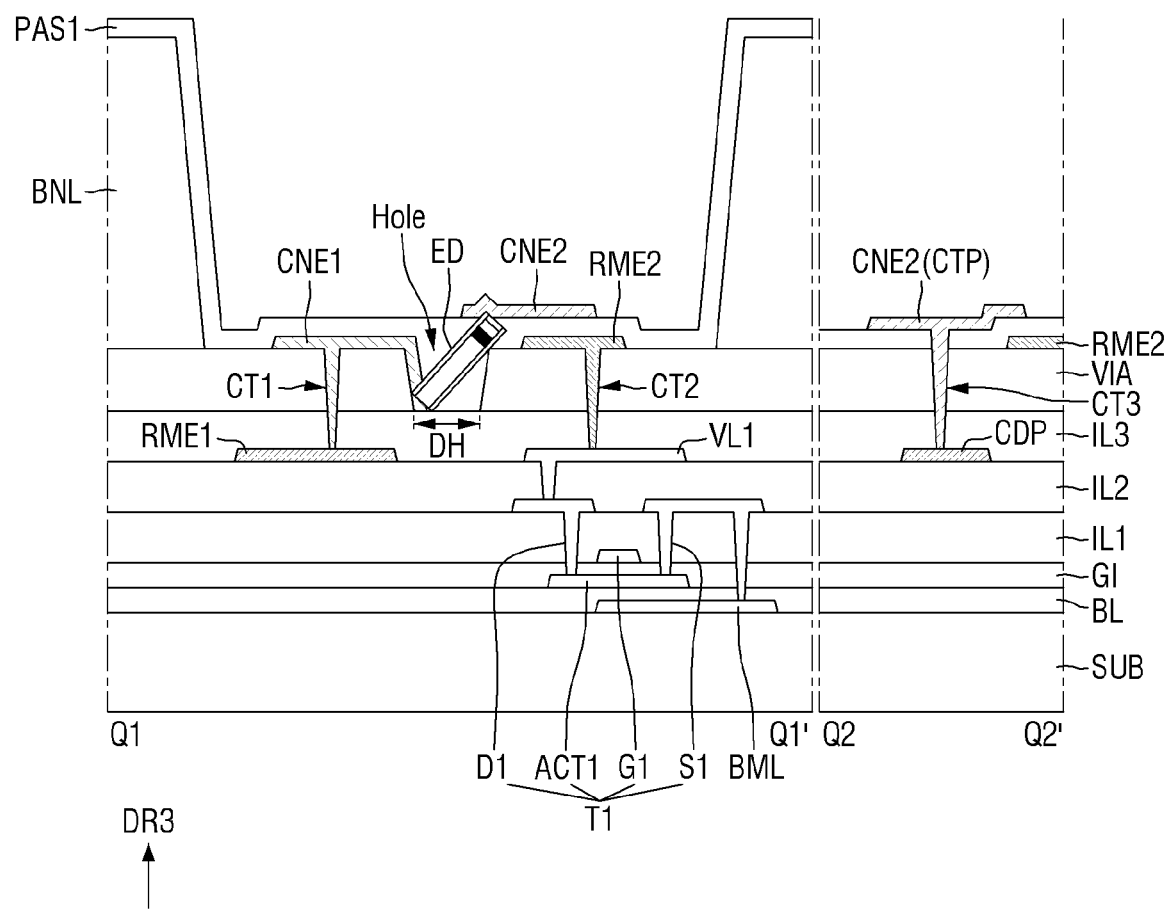
FIG. 4 is a schematic cross-sectional view taken along lines Q1-Q1' and Q2-Q2' of FIG. 3.

FIG. 3 is a schematic plan view illustrating a first sub-pixel of FIG. 2. FIG. 4 is a schematic cross-sectional view taken along lines Q1-Q1' and Q2-Q2' of FIG. 3. FIG. 4 shows a cross section traversing two ends of the light emitting element ED aligned in one sub-pixel PXn.

Referring to FIGS. 3 and 4 in association with FIG. 2, the display device 10 may include a first substrate SUB, and a semiconductor layer, conductive layers, and insulating layers that may be disposed on the first substrate SUB. The semiconductor layer, the conductive layers, and the insulating layers may each constitute a circuit layer and a light emitting element layer of the display device 10.

The first substrate SUB may be an insulating substrate. The first substrate SUB may be made of an insulating material such as glass, quartz, polymer resin, or a combination thereof. Further, the first substrate SUB may be a rigid substrate, but may also be a flexible substrate which can be bent, folded or rolled.

A light blocking layer BML may be disposed on the first substrate SUB. The light blocking layer BML may be arranged to overlap an active layer ACT1 of a first transistor T1. The light blocking layer BML may include a material blocking light to prevent light from reaching the active layer ACT1 of the first transistor T1. For example, the light blocking layer BML may be formed of an opaque metal material that blocks transmission of light. However, the disclosure is not limited thereto, and in some cases, the light blocking layer BML may be omitted.

A buffer layer BL may be disposed all over the first substrate SUB. For example, the buffer layer BL may be arranged to cover the top surfaces of the light blocking layer BML and the first substrate SUB. The buffer layer BL may be formed on the first substrate SUB to protect the first transistor T1 of the pixel PX from moisture permeating through the first substrate SUB susceptible to moisture permeation, and may perform a surface planarization function.

The active layer ACT1 may be disposed on the buffer layer BL. The active layer ACT1 may be arranged to partially overlap the gate electrode G1 of the first conductive layer to be described later.

Although only a first transistor T1 of the transistors included in the sub-pixel PXn of the display device 10 are shown in the drawing, the disclosure is not limited thereto. The display device 10 may include more transistors. For example, the display device 10 may include two or three transistors for each sub-pixel PXn by including one or more transistors in addition to the first transistor T1.

The active layer ACT1 may include polycrystalline silicon, monocrystalline silicon, an oxide semiconductor, or the like, or a combination thereof. In case that the active layer ACT1 includes the oxide semiconductor, the active layer ACT1 may include conductive regions and a channel region interposed therebetween. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO), or the like, or a combination thereof.

In another embodiment, the active layer ACT1 may include polycrystalline silicon. The polycrystalline silicon may be formed by crystallizing amorphous silicon and, the conductive region of the active layer ACT1 may be a region doped with impurities.

A first gate insulating layer GI may be disposed on the active layer ACT1 and the buffer layer BL. For example, the first gate insulating layer GI may be arranged to entirely cover the active layer ACT1 and the buffer layer BL. The first gate insulating layer GI may function as a gate insulating layer of each transistor.

The first conductive layer may be disposed on the first gate insulating layer GI. The first conductive layer may include the gate electrode G1 of the first transistor T1. The gate electrode G1 may be arranged to overlap the channel region of the active layer ACT1 in the thickness direction. Although not shown in the drawing, the first conductive layer may further include a first capacitance electrode of a storage capacitor. In some embodiments, the first capacitance electrode may be integrally connected to the gate electrode G1.

A first interlayer insulating layer IL1 may be disposed on the first conductive layer. The first interlayer insulating layer IL1 may function as an insulating layer between the conductive layer and other layers disposed thereon. The first interlayer insulating layer IL1 may be arranged to cover the first conductive layer to protect the first conductive layer.

A second conductive layer may be disposed on the first interlayer insulating layer IL1. The second conductive layer may include a first source electrode S1 and a first drain electrode D1 of the first transistor T1. The first source electrode S1 and the first drain electrode D1 of the first transistor T1 may each contact the doping region of the active layer ACT1 via a contact hole penetrating the first interlayer insulating layer IL1 and the first gate insulating layer GI. The first source electrode S1 of the first transistor T1 may also contact the light blocking layer BML via another contact hole. Although not shown in the drawing, the second conductive layer may further include a second capacitance electrode of the storage capacitor. In some embodiments, the second capacitance electrode may be integrally connected to the first source electrode S1. The second capacitance electrode may be arranged to overlap the first capacitance electrode in the thickness direction to form a storage capacitor therebetween. The second capacitance electrode may be integrally connected to the gate electrode G1.

Although not shown in the drawing, the second conductive layer may further include a data line for applying a data signal to another transistor. The data line may be electrically connected to the source/drain electrode of another transistor to transmit a signal applied from the data line.

A second interlayer insulating layer IL2 may be disposed on the second conductive layer. The second interlayer insulating layer IL2 may function as an insulating layer between the second conductive layer and other layers disposed thereon. The second interlayer insulating layer IL2 may also cover the second conductive layer to protect the second conductive layer.

A third conductive layer may be disposed on the second interlayer insulating layer IL2. The second conductive layer may include a first electrode RME1, a first voltage wiring VL1, and a first conductive pattern CDP. The first electrode RME1 may be applied with an alignment voltage necessary in case of aligning the light emitting elements ED as to be described later. Simultaneously, the first electrode RME1 may serve as a wiring for applying a first source voltage for driving the light emitting elements ED. The first voltage wiring VL1 may be applied with a second source voltage to be supplied to the first transistor T1.

The first electrode RME1 and the first voltage wiring VL1 may be arranged to extend in the second direction DR2. For example, the first electrode RME1 and the first voltage wiring VL1 may be spaced apart from each other in the first direction DR1 and extend in parallel, and may be disposed over the sub-pixels PXn arranged in the second direction DR2. In an embodiment, the first electrode RME1 may be used as a wiring, along with a second electrode RME2 to be described later, for applying an electrical signal for alignment of the light emitting elements ED during the manufacture of the display device 10. The first electrode RME1 and the first voltage wiring VL1 may also be used as a wiring for applying an electrical signal for driving the light emitting elements ED during the operation of the display device 10.

The first conductive pattern CDP may be electrically connected to the source electrode S1 of the first transistor T1. The first conductive pattern CDP may also contact a second contact electrode CNE2 to be described later, and the first transistor T1 may transfer the second source voltage received through the first voltage wiring VL1 to the second contact electrode CNE2. Although it is exemplarily shown in the drawing that the third conductive layer includes only the first electrode RME1, the first voltage wiring VL1, and the first conductive pattern CDP, the disclosure is not limited thereto, and the third conductive layer may include more electrodes or wirings.

A third interlayer insulating layer IL3 may be deposed on the third conductive layer. The third interlayer insulating layer IL3 may function as an insulating layer between the third conductive layer and other layers disposed thereon. Further, the third interlayer insulating layer IL3 may cover the third conductive layer to protect the third conductive layer.

The buffer layer BL, the first gate insulating layer GI, the first interlayer insulating layer IL1, the second interlayer insulating layer IL2, and the third interlayer insulating layer IL3 described above may be composed of inorganic layers deposited in an alternating manner. For example, the buffer layer BL, the first gate insulating layer GI, the first interlayer insulating layer IL1, and the second interlayer insulating layer IL2 may be formed as a double layer, formed by stacking, or a multilayer, formed by alternately stacking, inorganic layers including at least one of silicon oxide (SiOx), silicon nitride (SiNx), and silicon oxynitride (SiOxNy). Each of the aforementioned layers may be made of an inorganic layer.

Each of the first to third conductive layers may be formed as a single layer or multiple layers made of any of molybdenum (Mo), aluminum (Al), chromium (Cr), gold (Au), titanium (Ti), nickel (Ni), neodymium (Nd), copper (Cu) or an alloy thereof. However, the disclosure is not limited thereto.

The via layer VIA, the first electrode RME2, the bank BNL, the light emitting elements ED, and the contact electrodes CNE1 and CNE2 may be disposed on the third interlayer insulating layer IL3. A first insulating layer PAS1 may be further disposed on the third interlayer insulating layer IL3.

The via layer VIA may be disposed all over the third interlayer insulating layer IL3. In an embodiment, the via layer VIA may include a hole exposing a part of the top surface of the third interlayer insulating layer IL3. The hole may be formed in the emission area EMA of each sub-pixel PXn and have a shape extending in the second direction DR2. In some embodiments, the hole of the via layer VIA may be formed for each of the sub-pixels PXn to achieve a linear or a stripe pattern.

The hole may be disposed between the first electrode RME1 and the first voltage wiring VL1 so as not to overlap the first electrode RME1 disposed on the third conductive layer therebelow. The hole may be located in a region between the first electrode RME1 and the second electrode RME2 to be described layer so as to lie within the electric field formed on the first and second electrodes RME1 and RME2. However, the disclosure is not limited thereto, and the hole of the via layer VIA may be located to overlap the first electrode RME1. The hole may expose a part of the top surface of the third interlayer insulating layer IL3.

In an embodiment, the hole may form a space in which the light emitting elements ED may be aligned. At least a part of the light emitting elements ED may be disposed to lie inside the hole, and the light emitting elements ED elongated in one direction may be disposed not to be in parallel with the top surface of the first substrate SUB or the third interlayer insulating layer IL3. In the display device 10, the via layer VIA may be provided with the hole in which the light emitting elements ED may be aligned in the state of being erected in relation to the top surface of the first substrate SUB. For example, the light emitting element ED may be disposed at one end thereof to lie inside the hole and at the other end to be oriented upward in relation to the top surface of the first substrate SUB in an obliquely erected state in the hole. This may make it possible to improve light emission efficiency of the light emitting elements ED at ends thereof. A detailed description thereof will be given later.

The via layer VIA may include an organic insulating material, for example, an organic material such as polyimide (PI), and function to planarize the surface, forming a space for alignment of the light emitting elements ED.

The second electrode RME2 may be disposed for each sub-pixel PXn in a shape extending in one direction. The second electrode RME2 may be arranged to extend in the second direction DR2 on the via layer VIA. For example, one second electrode RME2 may be arranged in the emission area EMA of each sub-pixel PXn to be spaced apart from the first electrode RME1 in the first direction DR1 in plan view. The second electrode RME2 may be arranged to be spaced apart from the first electrode RME1 across the hole of the via layer VIA without overlapping the first electrode RME1. Although it is exemplarily shown in the drawing that one second electrode RME2 may be disposed in one sub-pixel PXn, the disclosure is not limited thereto. The second electrodes RME2 in each sub-pixel PXn may vary in number and alignment according to the location of the first electrode RME1 disposed in each sub-pixel PXn.

In an embodiment, the second electrode RME2 may overlap the first voltage wiring VL1 disposed on the third conductive layer therebelow in the thickness direction. The second electrode RME2 may be electrically connected to the first voltage wiring VL1 through the second contact hole CT2 penetrating the third interlayer insulating layer IL3 and the via layer VIA. The electrical signal applied to the first voltage wiring VL1 may be transmitted to the second electrode RME2 during the manufacturing process of the display device 10.

The second electrode RME2 may be disposed in the emission area EMA of each sub-pixel PXn, and partially overlap the bank BNL across the emission area EMA in the thickness direction. The second electrode RME2 may extend in the second direction DR2 within the corresponding sub-pixel PXn, and may be spaced apart from the second electrode RME2 of another sub-pixel PXn in the second direction DR2 within the cutout area CBA. Such an alignment of the second electrodes RME2 may be achieved by forming electrode lines extending in the second direction DR2 and separating them from each other in a process following alignment of the light emitting elements ED.

According to an embodiment, the first and second electrodes RME1 and RME2 may be used in generating an electric field in the sub-pixel PXn for aligning the light emitting elements ED during the manufacturing process of the display device 10. For example, it may be possible to generate an electric field on the first and second electrodes RME1 and RME2 by applying an electrical signal thereto. The light emitting elements ED of the display device 10 may be sprayed on the via layer VIA through an inkjet printing process, and the electric field generated on the first and second electrode RME1 and RME2 may apply a dielectrophoretic force to the light emitting elements ED dispersed in the ink. The light emitting element ED may be arranged at one end thereof to lie inside the hole of the via layer VIA, varying in its orientation according to the dielectrophoretic force produced by the electric field.

During the manufacturing process of the display device 10, an alignment signal may be applied to (e.g., directly to) the first electrode RME1 and applied to the second the second electrode RME2 through the first voltage wiring VL1. However, without being limited thereto, the second electrode RME2 may be formed as an electrode line extending in the second direction DR2 during the manufacturing process, and the alignment signal may be applied (e.g., directly applied) to the electrode line. The electrode line may be used to generate the electric field and, after the alignment of the light emitting elements ED, cut in the cutout area CBA to form the second electrode RME2 separately disposed for each sub-pixels PXn.

In an embodiment, the first and second electrodes RME1 and RME2 may be disposed in different layers. The first electrode RME1 may be formed with the third conductive layer located below the via layer VIA, and the second electrode RME2 may be disposed on the via layer VIA. The light emitting elements ED may be disposed to lie inside the hole of the via layer VIA, which may be caused by the electric field generated by the first and second electrodes RME1 and RME2 disposed in different layers. The first and second electrode RME1 and RME2 disposed in different layers may generate an electric field of which direction may not be parallel with the top surface of the first substrate SUB in comparison with an electric field being generated with the first and second electrode RME1 and RME2 disposed in the same layer. The electric field may cause the light emitting elements ED to be aligned in an erected state, and may allow the light emitting elements ED to be smoothly inserted and placed in the hole. The vertical distance between the first and second electrodes RME1 and RME2 may be adjusted such that the center of the electric field generated thereon may be located over the hole. A detailed description thereof will be given later with reference to other drawings.

A first source voltage for driving the light emitting elements ED may be applied to the first electrode RME1 during the operation of the display device 10. The first electrode RME1 may be electrically connected to the first contact electrode CNE1 to be described later and transmit the first source voltage to a first end of the corresponding light emitting element ED. The second source voltage applied from the first voltage wiring VL1 may be transmitted to the light emitting element ED through another electrode because the second electrode RME2 may not be directly connected to the light emitting element ED.

The second electrode RME2 may include a conductive material. For example, the second electrode RME2 may include a metal such as silver (Ag), copper (Cu), and aluminum (Al), or may be an alloy including aluminum (Al), nickel (Ni), and lanthanum (La) or the like. However, the disclosure is not limited thereto, and the second electrode RME2 may further include a transparent conductive material. For example, the second electrode RME2 may include a material such as ITO, IZO, and ITZO. In some embodiments, the second electrode RME2 may have a structure in which at least one transparent conductive material and at least one metal layer having high reflectivity may be stacked, or may be formed as one layer including the same. For example, the second electrode RME2 may have a stacked structure of ITO/Ag/ITO, ITO/Ag/IZO, ITO/Ag/ITZO/IZO, or the like.

The bank BNL may be disposed on the via layer VIA. The bank BNL may be disposed in the form of a grid pattern include parts extending in the first and second directions DR1 and DR2 in plan view. The bank BNL may be disposed along the boundaries between the sub-pixels PXn to delimit the neighboring sub-pixels PXn. The bank BNL may also be arranged to surround the emission area EMA and the cutout area CBA disposed for each sub-pixel PXn to delimit them from each other. Among the parts of the bank BNL extending in the second direction DR2, a part disposed between the emission areas EMA may have a larger width than a part disposed between the cutout areas CBA. The distance between the cutout areas CBA may be less than the distance between the emission areas EMA.

The bank BNL may be formed to have a height greater than that of the via layer VIA. The bank BNL may prevent ink from overflowing to adjacent sub-pixels PXn during the inkjet printing process of the manufacturing process of the display device 10, thereby separating inks in which different light emitting elements ED may be dispersed for the corresponding sub-pixels PXn such that the inks may not be mixed. The bank BNL may include polyimide as the via layer VIA does, but the disclosure is not limited thereto.

The light emitting elements ED may be disposed to lie inside the holes of the via layer VIA. The sub-pixels PXn may each have multiple light emitting elements ED aligned inside the hole of the via layer VIA extending in the second direction DR2, and they may be arranged to be spaced apart from each other along the second direction DR2 in which the electrodes RME1 and RME2 extend. According to an embodiment, the light emitting elements ED may each have a shape elongated in one direction that may not be parallel with the top surface of the first substrate SUB. For example, the light emitting element ED may be disposed such that a first end thereof lies inside the hole and at least a part thereof lies on the inner wall of the hole of the via layer VIA according to the length of the light emitting element ED.

In some embodiments, the light emitting element ED may be aligned in an obliquely erected state in relation to the top surface of the first substrate SUB inside the hole. The light emitting element ED may be aligned by the electric field generated by the first and second electrodes RME1 and RME2 such that the opposite ends of the light emitting element ED respectively face the first and second electrodes RME1 and RME2. The first and second electrodes RME1 and RME2 may be disposed on different layers, which may enable the light emitting element ED to be disposed such that two opposite ends of the light emitting element ED may be respectively oriented upward and downward. As a consequence, the light emitting element ED may be disposed such that one end thereof may be oriented in the third direction DR3 or a diagonal direction between the third direction DR3 and the first direction DR1 in an erected state in the hole of the via layer VIA. For example, the direction in which the light emitting element ED extends and the top surface of the first substrate SUB may form an acute angle or an angle greater than about 0 degrees and less than about 90 degrees.

In an embodiment, a width DH of the hole of the via layer VIA may be less than the length of the light emitting element ED in its extending direction. The hole of the via layer VIA may have the width DH large enough for only the one end of the light emitting element ED rather than the whole of the light emitting element ED to lie inside the hole. In some embodiments, the height of the top surface of the via layer VIA from the top surface of the first substrate SUB may be less than the height at which the other end of the light emitting element ED lies outside the hole. The light emitting element ED may be disposed such that only one end thereof lies inside the hole and the other end thereof lies at a height above the top surface of the via layer VIA. If the first and second electrodes RME1 and RME2 separated by the via layer VIA therebetween generate an electric field, the light emitting element ED may be disposed such that only one end thereof lies on the inner wall of the hole and the other end thereof sticks out of the hole. As a consequence, the light emitting element ED may be aligned in an erected state inside the hole such that one end thereof mostly face upward. However, the disclosure is not limited thereto, the width DH of the hole may be greater than the length of the light emitting element ED in the case where the electrodes RME1 and RME2 may be designed along with the hole to allow the light emitting element ED to lie in an erected state.

The light emitting elements ED may include semiconductor layers doped with different conductivity type dopants. The light emitting element ED may include semiconductor layers and may be oriented such that one end thereof faces a certain direction according to the direction of the electric field generated on the electrodes RME1 and RME2. Further, the light emitting element ED may include a light emitting layer 36 (see FIG. 5) to emit light of a predetermined wavelength band. The light emitting element ED aligned in each sub-pixel PXn may emit light of a different wavelength band according to the material constituting the light emitting layer 36. However, the disclosure is not limited thereto, and the light emitting element ED aligned in each sub-pixel PXn may emit the same color light.

The light emitting element ED may include different semiconductor layers arranged to have the light emitting layer 36 therebetween, and may be divided into a first end and a second end by the semiconductor layers. For example, the light emitting element ED may include the first end lying inside the hole of the via layer VIA and the second end lying on the inner wall of the hole as the opposite end of the first end. Although the light emitted from the light emitting layer 36 of the light emitting element ED has no directivity, most lights may be emitted from both the longitudinal ends, i.e., the first and second ends, of the light emitting element ED. Because the light emitting element ED may be elongated in a direction that may not be parallel with the top surface of the first substrate SUB, at least the lights emitted from the second end of the light emitting element ED may be projection (e.g., directly projected) upward away from the first substrate SUB. The display device 10 according to an embodiment may be characterized by the light emitting elements ED aligned in an erected state inside holes of the via layer VIA, which may lead to improvement of light emission efficiency of the light emitting elements ED even in case that the light emitting elements ED emit lights through ends thereof. Particularly, the display device 10 can be manufactured with no structure reflecting the lights emitted from the light emitting elements ED, which may be advantageous in terms of securing a space for a manufacturing process and a structure design of each sub-pixel PXn.

The ends of the light emitting element ED may contact respective contact electrodes CNE1 and CNE2. The side end surfaces of the light emitting element ED may not be covered by an insulating layer 38 (see FIG. 5) such that the semiconductor layers may be partially exposed. Thus, the exposed semiconductor layers may contact the contact electrodes CNE1 and CNE2. However, the disclosure is not limited thereto. In some cases, in the light emitting element ED, at least a portion of the insulating layer 38 may be removed, and the insulating layer 38 may be removed, so that the side surfaces at ends of the semiconductor layers may be partially exposed. The side surfaces of the exposed semiconductor layer may be in direct contact with the contact electrodes CNE1 and CNE2. The first and second ends of the light emitting element ED may contact the respective contact electrodes CNE1 and CNE2 from which the source voltage may be received for emitting light.

On the light emitting element ED, the first insulating layer PAS1 and the first and second contact electrodes CNE1 and CNE2 may be disposed.

The first contact electrode CNE1 may be disposed on the via layer VIA. For example, the first contact electrode CNE1 may be disposed on one side of the flat top surface of the via layer VIA divided by the hole. The first contact electrode CNE1 may be arranged to partially overlap the first electrode RME1 in the thickness direction, and a part of the first contact electrode CNE1 may be disposed on the inner wall of the hole. The first contact electrode CNE1 may also be arranged to extend in the second direction DR2 in the emission aera EMA of each sub-pixel PXn. The first contact electrode CNE1 may be disposed for each sub-pixel PXn to form a linear or stripe pattern on the whole surface of the display area DPA.

The first contact electrode CNE1 may be electrically connected to the first electrode RME1 and the first end of the light emitting element ED. In an embodiment, the first contact electrode CNE1 may be electrically connected to the first electrode RME1 through the first contact hole CT1 penetrating the via layer VIA and the third interlayer insulating layer IL3 therebeneath. Further, the first contact electrode CNE1 may contact (e.g., directly contact), at a part thereof disposed on the inner wall of the hole, the first end of the light emitting element ED. During the operation of the display device 10, the first source voltage applied to the first electrode RME1 may be transmitted to the first end of the light emitting element ED through the first contact electrode CNE1.

The first insulating layer PAS1 may be disposed all over the surfaces of the first contact electrode CNE1 and the via layer VIA. For example, the first insulating layer PAS1 may be arranged to cover the first contact electrode CNE1, the via layer VIA, and the bank BNL while exposing at least a part of the second end of the light emitting element ED. The first insulating layer PAS1 may be arranged to partially surround the outer surface of the light emitting element ED to protect the light emitting element ED and simultaneously fix the light emitting element ED during the manufacturing process of the display device 10. The first insulating layer PAS1 may also be arranged to fill the hole of the via layer VIA. The first insulating layer PAS1 may be formed in such a way of being arranged to completely cover the light emitting element ED and selectively removed to expose at least a part of the second end of the light emitting element ED during the manufacturing process of the display device 10.

The second contact electrode CNE2 may be disposed on the first insulating layer PAS1. For example, the second contact electrode CNE2 may be disposed at the opposite side of the first contact electrode CNE1 across the hole. The second contact electrode CNE2 may be arranged to be spaced apart from the first contact electrode CNE1 in the first direction DR1 within the emission area EMA of each sub-pixel PXn and extend in the second direction DR2. The second contact electrode CNE2 may be disposed for each sub-pixel PXn to form a linear or stripe pattern all over the surface of the display area DPA.

The second contact electrode CNE2 may be electrically connected to the first transistor T1 and the second end of the light emitting element ED. In an embodiment, the second contact electrode CNE2 may further include an electrode contact portion CTP disposed on a part spaced apart from the hole of the via layer VIA in the second direction DR2 in plan view, and the electrode contact portion CTP may be electrically connected to the first conductive pattern CDP through the third contact hole CT3 penetrating the first insulating layer PAS1, the via layer VIA, and the third interlayer insulating layer IL3 therebeneath. As described above, the first conductive pattern CDP may be electrically connected to the source electrode S1 of the first transistor T1, and the second contact electrode CNE2 may be electrically connected to the first transistor T1. A part of the second electrode CNE2 may contact (e.g., directly contact) the second end of the light emitting element ED which sticks out from the first insulating layer PAS1. During the operation of the display device 10, the second source voltage applied to the first voltage wiring VL1 may be transmitted to the second end of the light emitting element ED through the first transistor T1 and the second contact electrode CNE2. The first and second ends of the light emitting element ED may be electrically connected to the respective contact electrodes CNE1 and CNE2 different from each other to receive an electrical signal for light emission.

In an embodiment, the second contact electrode CNE2 may be arranged to partially overlap the second electrode RME2 in the thickness direction with no connection to the second electrode RME2. The second electrode RME2 and the second contact electrode CNE2 may be insulated from each other by the first insulating layer PAS1 interposed therebetween. The second contact electrode CNE2 may receive the second source voltage applied to the first voltage wiring VL1 only through the first transistor T1 and, even in case that the second source voltage may be applied to the first voltage wiring VL1, the light emitting elements ED aligned in each sub-pixel PXn may operate individually via the first transistor T1.

Although it is shown in the drawing that one first contact electrode CNE1 and one second contact electrode CNE2 may be disposed for one sub-pixel PXn, the disclosure is not limited thereto.

The contact electrodes CNE1 and CNE2 may include a conductive material. For example, they may include ITO, IZO, ITZO, aluminum (Al), or the like, or a combination thereof. For example, the contact electrodes CNE1 and CNE2 may include a transparent conductive material, and the light emitted from the light emitting element ED may pass through the contact electrodes CNE1 and CNE2 to be emitted. However, the disclosure is not limited thereto. The contact electrodes CNE1 and CNE2, like the second electrode RME2, may include a metal such as silver (Ag), copper (Cu), and aluminum (Al), or may be an alloy including aluminum (Al), nickel (Ni), and lanthanum (La). The contact electrodes CNE1 and CNE2 may have a stacked structure of ITO/Ag/ITO, ITO/Ag/IZO, ITO/Ag/ITZO/IZO, or the like.

Although not shown in the drawing, an insulating layer may be further arranged to cover the first insulating layer PAS1 and the second contact electrode CNE2. The insulating layer may be disposed all over the first substrate SUB to protect the members disposed on the first substrate SUB from the external environment.

The above-described first insulating layer PAS1 may include an inorganic insulating material or an organic insulating material. In an embodiment, the first insulating layer PAS1 may include an inorganic insulating material such as silicon oxide (SiOx), silicon nitride (SiNx), silicon oxynitride (SiOxNy), aluminum oxide (AlxOy), or aluminum nitride (AlxNy), or a combination thereof. In other embodiments, the first insulating layer PAS1 may include an organic insulating material such as acrylic resin, epoxy resin, phenolic resin, polyamide resin, polyimide resin, unsaturated polyester resin, polyphenylene resin, polyphenylenesulfide resin, benzocyclobutene, cardo resin, siloxane resin, silsesquioxane resin, polymethylmethacrylate, polycarbonate, polymethylmethacrylate-polycarbonate synthetic resin, or the like, or a combination thereof. However, the disclosure is not limited thereto.

The display device 10 according to an embodiment may include the light emitting elements ED each including electrodes RME1 and RME2 disposed in different layers and the via layer VIA with holes and each having a shape elongated in one direction not parallel with the top surface of the first substrate SUB. In the display device 10, the light emitting elements ED may be aligned in an erected state inside holes such that the most lights emitted from ends of the light emitting elements ED may be emitted upward away from the first substrate SUB. The display device 10 manufactured to have the above-described characteristics may be advantageous in terms of improving light emission efficiency of the sub-pixels PXn without additional structures and securing a space for a structure design of each pixel PXn.

Figure 5:
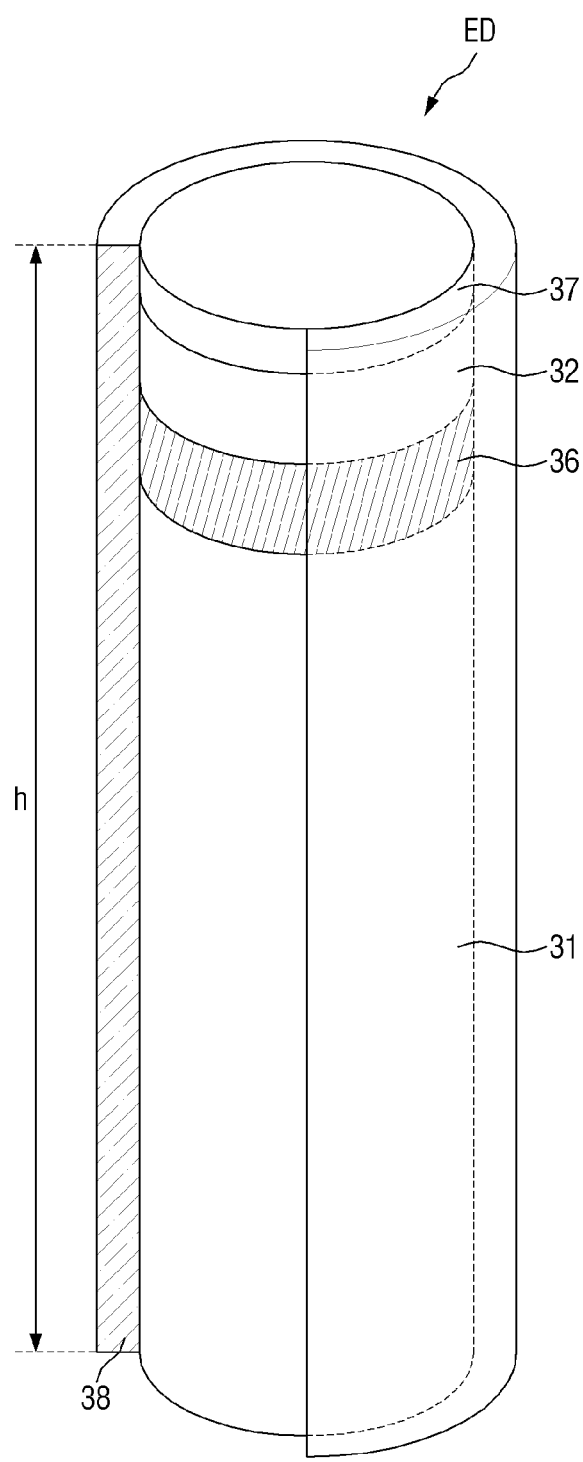
FIG. 5 is a schematic diagram of a light emitting element according to an embodiment.

FIG. 5 is a schematic diagram of a light emitting element according to an embodiment.

The light emitting element ED may be a light emitting diode. Specifically, the light emitting element ED may be an inorganic light emitting diode that has a micrometer or nanometer size, and may be made of an inorganic material. The inorganic light emitting diode may be aligned between two electrodes having polarity in case that an electric field may be formed in a specific direction between two electrodes facing each other. Each light emitting element ED may be aligned between two electrodes by the electric field generated between the electrodes.

The light emitting element ED according to an embodiment may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface partially inclined. Semiconductors included in the light emitting element ED to be described later may have a structure in which they may be sequentially disposed or stacked along the one direction.

The light emitting element ED may include a semiconductor layer doped with any conductivity type (e.g., p-type or n-type) impurities. The semiconductor layer may emit light of a specific wavelength band by receiving an electrical signal applied from an external power source.

Referring to FIG. 5, the light emitting element ED may include a first semiconductor layer 31, a second semiconductor layer 32, a light emitting layer 36, an electrode layer 37, and an insulating layer 38.

The first semiconductor layer 31 may be an n-type semiconductor. In case that the light emitting element ED emits light of a blue wavelength band, the first semiconductor layer 31 may include a semiconductor material having a chemical formula of AlxGayIn1-x-yN ($0 \leq x \leq 1$, $0 \leq y \leq 1$, $0 \leq x+y \leq 1$). For example, it may be any one or more of n-type doped AlGaInN, GaN, AlGaN, InGaN, MN and InN. The first semiconductor layer 31 may be doped with an n-type dopant, and the n-type dopant may be Si, Ge, Sn, or the like, or a combination thereof. For example, the first semiconductor layer 31 may be n-GaN doped with n-type Si. The length of the first semiconductor layer 31 may have a range of about 1.5 μm to about 5 μm, but is not limited thereto. The first end of the light emitting element ED may be a part in which the first semiconductor layer 31 may be disposed in relation to the light emitting layer 36.

The second semiconductor layer 32 may be disposed on the light emitting layer 36 to be described later. The second semiconductor layer 32 may be a p-type semiconductor. In case that the light emitting element ED emits light of a blue or green wavelength band, the second semiconductor layer 32 may include a semiconductor material having a chemical formula of AlxGayIn1-x-yN ($0 \leq x \leq 1$, $0 \leq y \leq 1$, $0 \leq x+y \leq 1$). For example, it may be any one or more of p-type doped AlGaInN, GaN, AlGaN, InGaN, MN and InN. The second semiconductor layer 32 may be doped with a p-type dopant, and the p-type dopant may be Mg, Zn, Ca, Se, Ba, or the like, or a combination thereof. For example, the second semiconductor layer 32 may be p-GaN doped with p-type Mg. The length of the second semiconductor layer 32 may have a range of about 0.05 μm to about 0.10 μm, but is not limited thereto. The second end of the light emitting element ED may be a part in which the second semiconductor layer 32 may be disposed in relation to the light emitting layer 36.

Although it is illustrated in the drawing that the first semiconductor layer 31 and the second semiconductor layer 32 may be configured as one layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately. The light emitting layer 36 may emit light by coupling of electron-hole pairs according to an electrical signal applied through the first semiconductor layer 31 and the second semiconductor layer 32. In case that the light emitting layer 36 emits light of a blue wavelength band, a material such as AlGaN or AlGaInN may be included. In particular, in case that the light emitting layer 36 has a structure in which quantum layers and well layers may be alternately stacked in a multiple quantum well structure, the quantum layer may include a material such as AlGaN or AlGaInN, and the well layer may include a material such as GaN or AlInN. For example, as described above, the light emitting layer 36 may include AlGaInN as a quantum layer and AlInN as a well layer, and the light emitting layer 36 may emit blue light having a central wavelength band of about 450 nm to about 495 nm.

However, the disclosure is not limited thereto, and the light emitting layer 36 may have a structure in which semiconductor materials having large band gap energy and semiconductor materials having small band gap energy may be alternately stacked, and may include other group III to V semiconductor materials according to the wavelength band of the emitted light. The light emitted by the light emitting layer 36 is not limited to light of a blue wavelength band, but the active layer 36 may also emit light of a red or green wavelength band in some cases. The length of the light emitting layer 36 may have a range of about 0.05 µm to about 0.10 µm, but is not limited thereto.

Light emitted from the light emitting layer 36 may be emitted to both side surfaces as well as the outer surface of the light emitting element ED in the longitudinal direction. The directionality of light emitted from the light emitting layer 36 is not limited to one direction.

The electrode layer 37 may be an ohmic contact electrode. However, the disclosure is not limited thereto, and it may be a Schottky contact electrode. The light emitting element ED may include at least one electrode layer 37. Although FIG. 5 illustrates that the light emitting element ED may include one electrode layer 37, the disclosure is not limited thereto. In some cases, the light emitting element ED may include a larger number of electrode layers 37 or may be omitted. The following description of the light emitting element ED may be equally applied even if the number of electrode layers 37 may be different or further includes other structures.

In the display device 10 according to an embodiment, in case that the light emitting element ED is electrically connected to an electrode or a contact electrode, the electrode layer 37 may reduce the resistance between the light emitting element ED and the electrode or contact electrode. The electrode layer 37 may include conductive metal. For example, the electrode layer 370 may include at least one of aluminum (Al), titanium (Ti), indium (In), gold (Au), silver (Ag), ITO, IZO, or ITZO. Further, the electrode layer 37 may include an n-type or p-type doped semiconductor material. However, the disclosure is not limited thereto.

The insulating layer 38 may be arranged to surround the outer surfaces of the semiconductor layers and electrode layers described above. For example, the insulating layer 38 may be arranged to surround the outer surface of at least the light emitting layer 36, and the light emitting element ED may be elongated in one direction. The insulating layer 38 may function to protect the members. The insulating layer 38 may be formed to surround side surfaces of the members to expose ends of the light emitting element ED in the longitudinal direction.

Although it is illustrated in the drawing that the insulating layer 38 extends in the longitudinal direction of the light emitting element ED to cover a region from the first semiconductor layer 31 to the side surface of the electrode layer 37, the disclosure is not limited thereto. The insulating layer 38 may include the light emitting layer 36 to cover only the outer surfaces of some semiconductor layers, or may cover only a portion of the outer surface of the electrode layer 37 to partially expose the outer surface of each electrode layer 37. Further, in cross-sectional view, the insulating layer 38 may have a top surface, which may be rounded in a region adjacent to at least one end of the light emitting element ED.

The thickness of the insulating layer 38 may have a range of about 10 nm to about 1.0 µm, but is not limited thereto. The thickness of the insulating layer 38 may be approximately 40 nm.

The insulating layer 38 may include a material having insulating properties, such as silicon oxide (SiOx), silicon nitride (SiNx), silicon oxynitride (SiOxNy), aluminum nitride (AlN), aluminum oxide 9AlxOy), or a combination thereof. Although it is shown in the drawing that the insulating layer 38 may be formed as a single layer, the disclosure is not limited thereto. In some embodiments, the insulating layer 38 may be formed in a multilayer structure in which multiple layers may be stacked. Accordingly, it may be possible to prevent an electrical short circuit that may occur in case that the light emitting layer 36 may be in direct contact with the electrode through which the electrical signal may be transmitted to the light emitting element ED. Since the insulating layer 38 protects the outer surface of the light emitting element ED including the light emitting layer 36, it may be possible to prevent a decrease in light emission efficiency.

Further, the insulating layer 38 may have an outer surface which may be surface-treated. The light emitting elements ED may be aligned in such a way of spraying the ink in which the light emitting elements ED may be dispersed on the electrodes. Here, the surface of the insulating layer 38 may be treated in a hydrophobic or hydrophilic manner in order to keep the light emitting elements ED in a dispersed state without aggregation with other light emitting elements ED adjacent in the ink. For example, the insulating layer 38 may be surface-treated on the outer surface thereof with a material such as stearic acid and 2,3-naphthalene dicarboxylic acid.

The light emitting element ED may have a length h of about 1 µm to about 10 µm or about 2 µm to about 6 µm, or about 3 µm to about 5 µm. Further, a diameter of the light emitting element ED may have a range of about 30 nm to about 700 nm, and an aspect ratio of the light emitting element ED may be about 1.2 to about 100. However, the disclosure is not limited thereto, and the light emitting elements ED included in the display device 10 may have different diameters according to a difference in composition of the light emitting layer 36. The diameter of the light emitting element ED may have a range of about 500 nm.

The display device 10 may include the light emitting elements elongated in one direction that may be not parallel with the top surface of the first substrate SUB. The display device 10 may be advantageous in terms of improving its light emission efficiency by increasing the amount of light traveling upward away from the first substrate SUB of the display device 10 among the lights emitted from the ends, in the elongated direction, of the light emitting elements ED. The display device 10 according to an embodiment may be manufactured such that an electric field may be generated to have a direction that may not be parallel with the first substrate SUB during the alignment process for aligning the light emitting elements ED, thereby causing the light emitting elements ED to be aligned in an erected state according to the direction of the electric field. Hereinafter, a manufacturing process of the display device 10 will be described with reference to other drawings.

FIGS. 6 to 9 are schematic cross-sectional views sequentially illustrating a part of a manufacturing process of a display device according to an embodiment.

Figure 6:
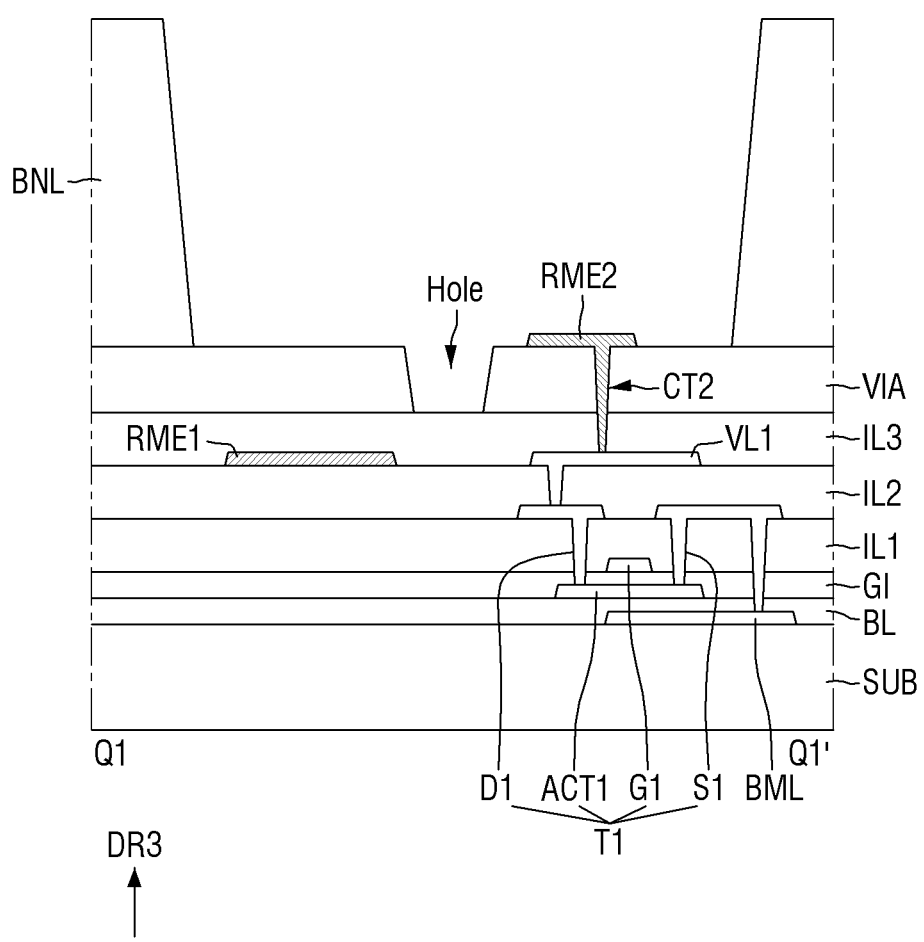
FIGS. 6 to 9 are schematic cross-sectional views sequentially illustrating a part of a manufacturing process of a display device according to an embodiment.

Referring to FIG. 6, a first substrate SUB may be prepared, and a circuit layer on the first substrate SUB, a via layer VIA disposed on a third interlayer insulating layer IL3 of the circuit layer, a second electrode RME2, and a bank BNL may be formed. Conductive layers and active layers of the circuit layer may be formed through a mask process. For example, the conductive layers and active layers may be formed as shown in FIG. 6 in such a way of depositing a material layer for a conductive layer all over the surface of a layer thereunder or the first substrate SUB and patterning the material layer through a photolithography process. Further, insulating layers of the circuit layer may be formed by depositing a material layer for an insulating layer on a layer thereunder or the first substrate SUB. Hereinafter, descriptions may be made of the order for forming the respective layers or structures thereof in detail with the omission of the description of the method for forming the respective layers.

The first electrode RME1 may be disposed on the third conductive layer, and the second electrode RME2 may be disposed on the via layer VIA. The via layer VIA may include a hole formed in the emission area EMA of each sub-pixel PXn, and the first and second electrodes RME1 and RME2 may be arranged to be separated from each other such that the hole may be located therebetween. The via layer VIA has a second contact hole CT2 formed therein to penetrate the third interlayer insulating layer IL3 beneath the via layer VIA, and the second electrode RME2 may be electrically connected to the first voltage wiring VL1 through the second contact hole CT2.

The bank BNL may be formed on the via layer VIA after the second electrode RME2 may be formed. The bank BNL may be formed to surround the emission area EMA in which the hole may be located.

Figure 7:
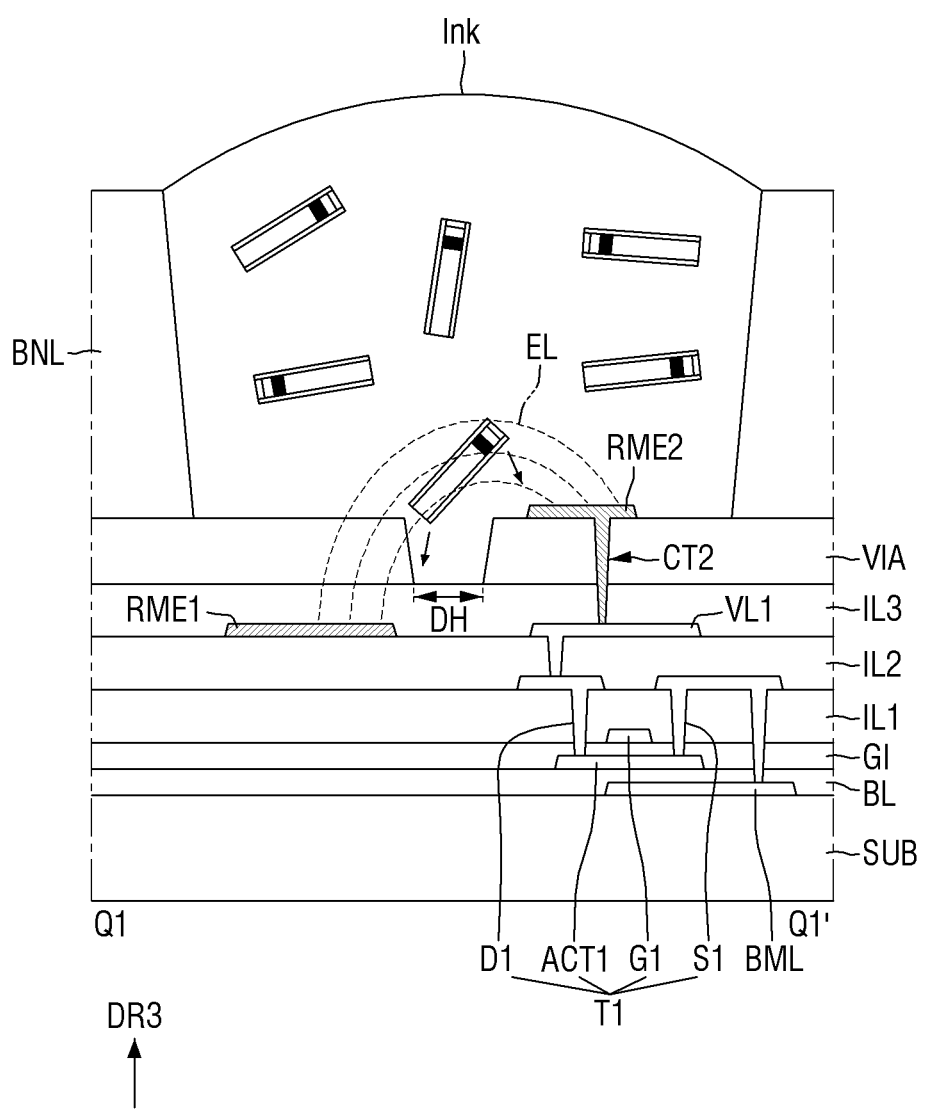

Referring to FIG. 7, the ink in which the light emitting elements ED may be dispersed may be sprayed within the emission area EMA surrounded by the bank BNL, and the light emitting elements ED may be aligned by an electric field EL generated on the first and second electrodes RME1 and RME2. In an embodiment, the light emitting elements ED may be prepared in the state of being dispersed in the ink, and may be sprayed within the emission area EMA of each sub-pixel PXn through an inkjet printing process. After the ink may be sprayed, an alignment signal may be applied to the first and second electrodes RME1 and RME2 to generate the electric field EL thereon. In an embodiment, the alignment signal may be applied to (e.g., directly to) the first electrode RME1 and applied to the second electrode RME2 via the first voltage wiring VL1 of the third conductive layer. However, the disclosure is not limited thereto, and the second electrode RME2 may extend in the second direction DR2 to form an electrode line crossing sub-pixels PXn during the manufacturing process of the display device 10, and the alignment signal may be applied to (e.g., directly applied to) the electrode line.

The light emitting elements ED dispersed in the ink may each be aligned to lie inside the hole of the via layer VIA, changing in orientation and location according to a dielectrophoretic force produced by the electric field EL. The electric field EL generated on the separated electrodes RME1 and RME2 may have a shape of a parabola connecting the first and second electrodes RME1 and RME2. The display device 10 may be manufactured such that the first and second electrodes RME1 and RME2 for generating the electric field EL may be disposed on different layers, which generates the electric field EL of which the direction oriented from one electrode to the other electrode may be aligned with the upward direction of the first substrate SUB or a direction oblique to the upward direction. As shown in FIG. 7, the first and second electrodes RME1 and RME2 may be disposed on different layers to be separated from each other in the first direction DR1, in cross-section view, thereby causing the electric field EL to be generated in a diagonal direction. As the electric field EL may be generated to have a shape of a parabola oriented in a specific direction, a center of the electric field EL have a parabola shape that may be defined at the highest point from a reference line connecting straight between the electrodes RME1 and RME2. The light emitting elements ED may be aligned to be oriented to the electric field EL, changing location according to the dielectrophoretic force.

According to an embodiment, the display device 10 may be characterized in that a vertical distance DE between the first and second electrodes RME1 and RME2 and the locations of the first and second electrodes RME1 and RME2 may be adjusted to locate the center of the electric field EL over the hole. For example, the first and second electrodes RME1 and RME2 may be arranged to be separated from each other to have the center of the hole interposed therebetween such that the vertical distance DE between the first and second electrodes RME1 and RME2 may be greater than the width DH of the hole. The first and second electrodes RME1 and RME2 may generate the electric field EL to pass through the hole of the via layer VIA, and the center of the electric field EL may be located inside the hole or to be parallel with the hole in the third direction DR3. The light emitting element ED may be oriented such that the first and second ends thereof respectively face the first and second electrodes RME1 and RME2, changing its posture to be oriented to the center of the electric field EL according to the electric field EL. The light emitting element ED may be aligned to lie inside the hole, facing the center of the electric field EL, and the first electrode RME1 may be located below the via layer VIA such that the light emitting element ED may be aligned in an obliquely erected state in which the first end lies inside the hole and the second end faces the second electrode RME2. The display device 10 may be characterized in that the locations of the first and second electrodes RME1 and RME2 and the vertical distance DE therebetween may be adjusted, which may cause the light emitting elements ED to lie inside the holes of the via layer VIA. The light emitting elements ED may each be erected such that the second end may be oriented in the third direction DR3 or a direction oblique to the third direction DR3, which leads to improvement of light emission efficiency at ends of the light emitting elements ED.

Figure 8:
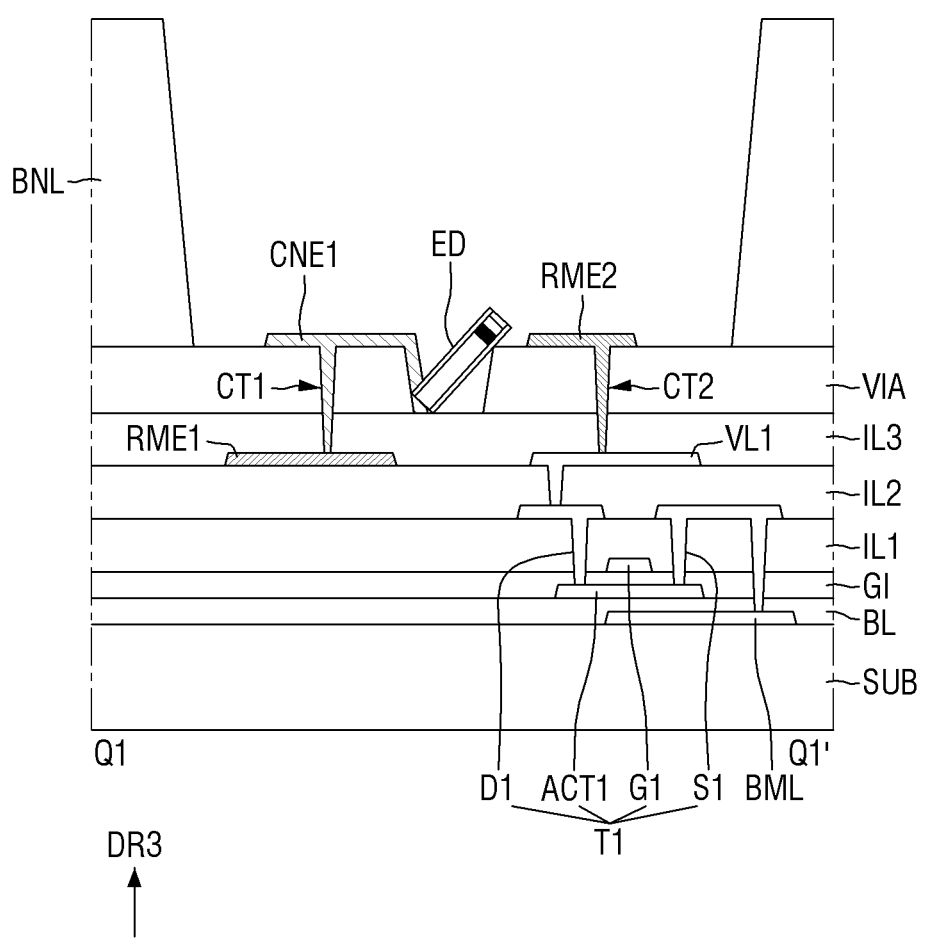
Figure 9:
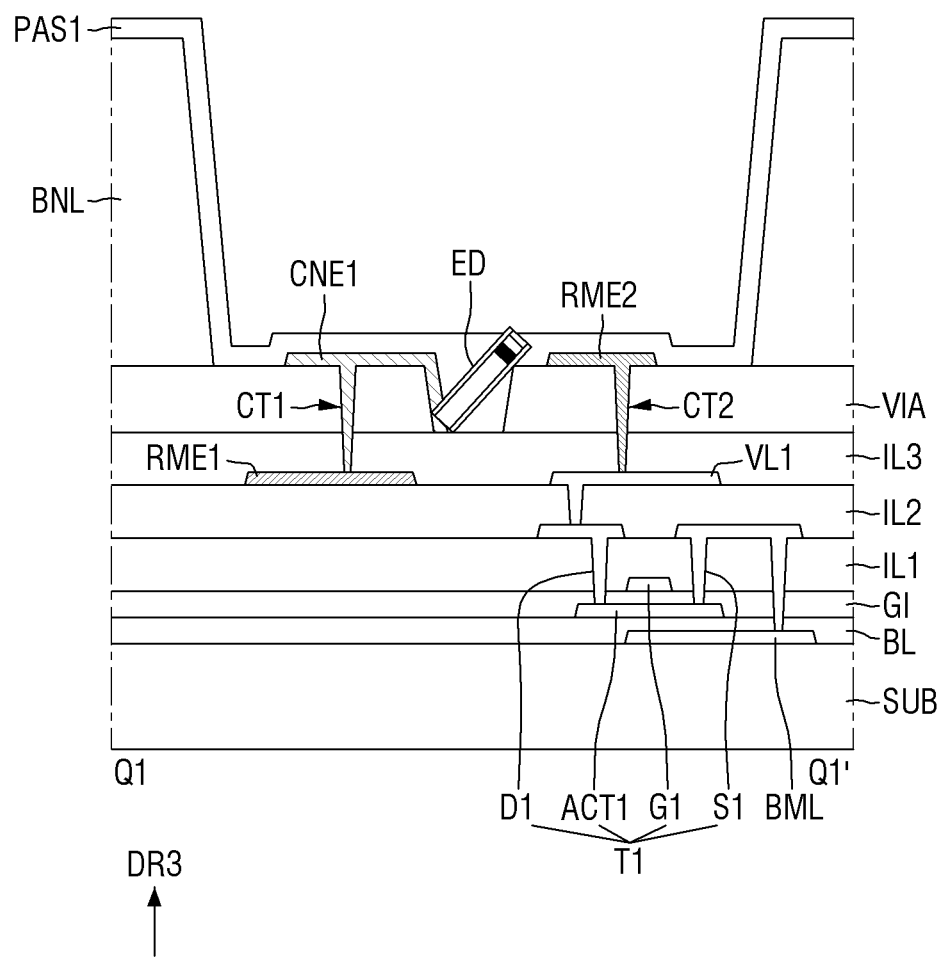

Referring to FIGS. 8 and 9, the first contact electrode CNE1 contacting the first electrode RME1 and the first end of the light emitting element ED may be formed, and the first insulating layer PAS1 covering the first contact electrode CNE1, the second electrode RME2, and the via layer VIA may be formed. The first contact electrode CNE1 may be arranged to contact the first electrode RME1 through the first contact hole CT1 penetrating the via layer VIA and the third interlayer insulating layer IL3, and the first insulating layer PAS1 may be arranged to partially cover the light emitting element ED to expose at least a part of the second end. Although not shown in the drawing, the display device 10 may be manufactured such that the second contact electrode CNE2 contacting the second end of the light emitting element ED may be formed.

The display device 10 may be manufactured such that the light emitting elements ED may be aligned in an erected state obliquely to the top surface of the first substrate SUB, which may lead to improvement of light emission efficiency of the light emitting elements ED. Although the embodiment of FIG. 4 exemplifies that the light emitting elements ED may be aligned such that only the first end of each light emitting element ED lies inside the hole of the via layer VIA due to the small size of the hole, the light emitting elements ED may be aligned in an obliquely erected state by changing the arrangements of the hole of the vial layer VIA and the electrodes RME1 and RME2 in various manners. Hereinafter, other embodiments of the display device 10 will be described with reference to other drawings.

Figure 10:
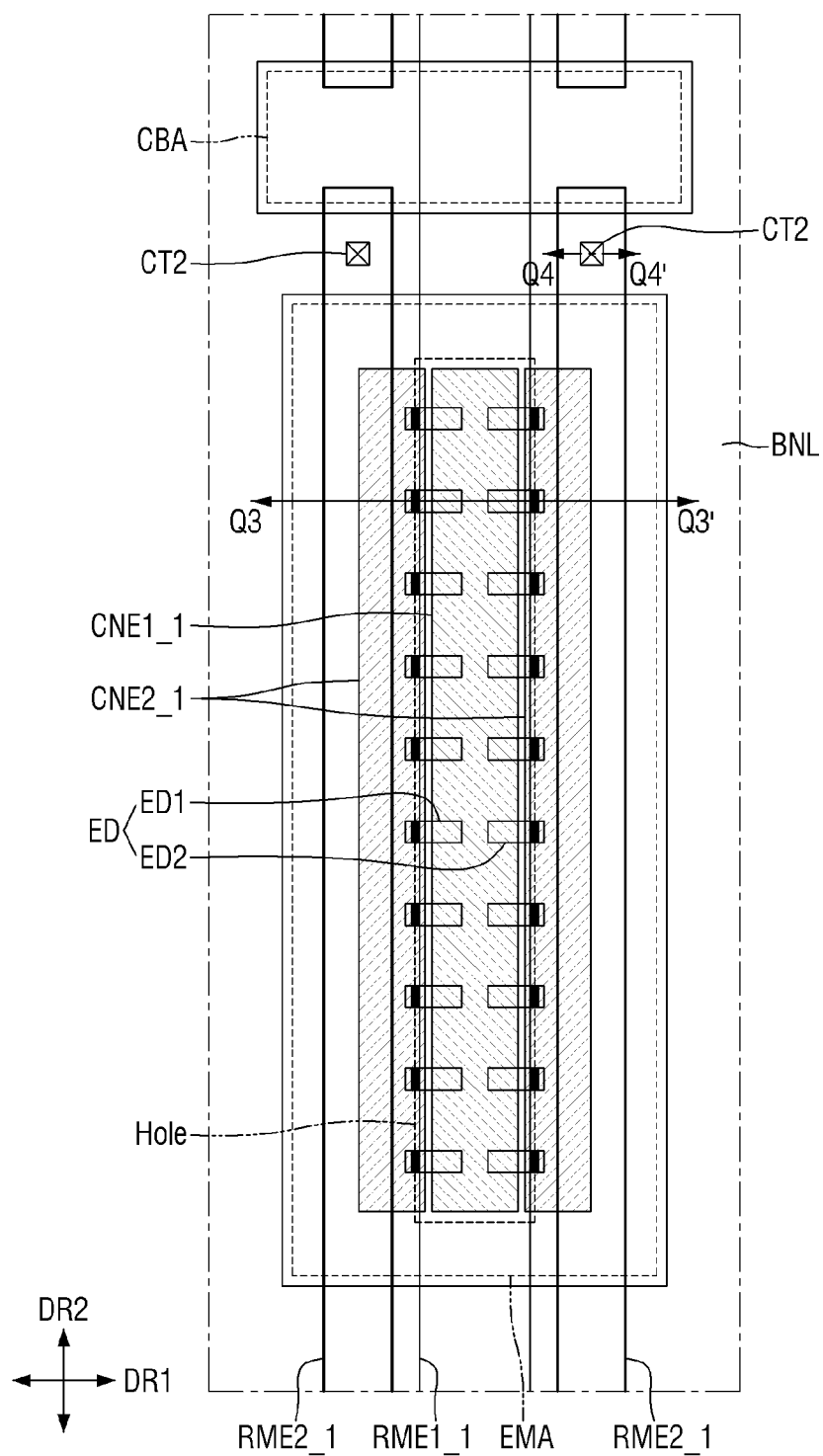
FIG. 10 is a schematic plan view illustrating a sub-pixel of a display device according to another embodiment.
Figure 11:
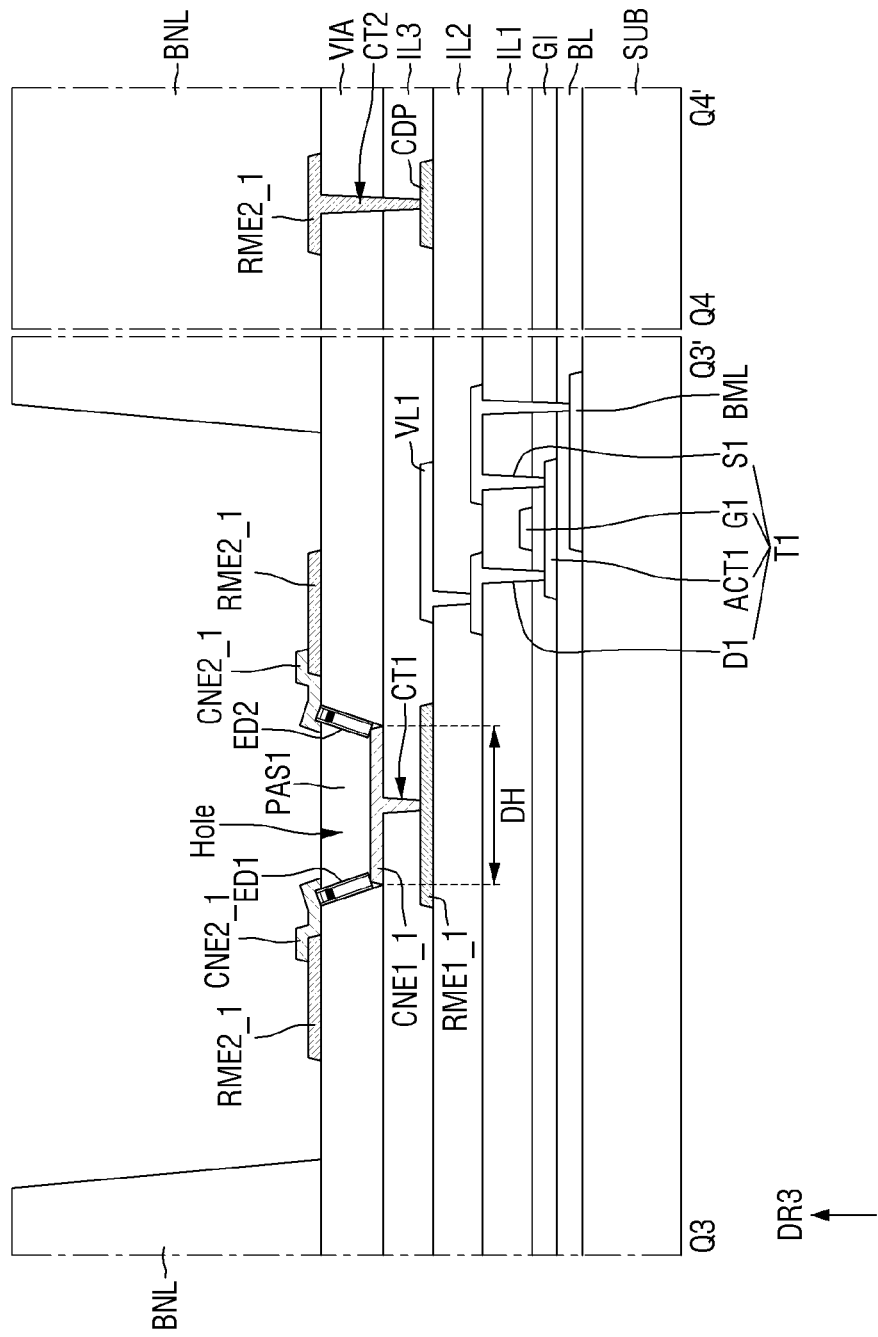
FIG. 11 is a schematic cross-sectional view taken along lines Q3-Q3' and Q4-Q4' of FIG. 10.

FIG. 10 is a schematic plan view illustrating a sub-pixel of a display device according to another embodiment. FIG. 11 is a schematic cross-sectional view taken along lines Q3-Q3' and Q4-Q4' of FIG. 10.

Referring to FIGS. 10 and 11, a display device 10_1 according to an embodiment may include a first electrode RME1_1 disposed below the hole of the via layer VIA and second electrodes RME2_1 separated from each other by the hole interposed therebetween. The second electrodes RME2_1 may be respectively disposed at both sides of the first electrode RME1_1 such that the first electrode RME1_1 may be located at the center therebetween. Thus, electric fields EL may be generated at both sides of the hole of the via layer VIA during the manufacturing process of the display device 10_1. The light emitting elements ED may include a first light emitting element ED1 lying on one side of the inner wall of the hole of the via layer VIA and a second light emitting element ED2 lying on the other side of the inner wall of the hole of the via layer VIA. This embodiment differs from the embodiment of FIGS. 3 and 4 in that the first and second electrodes RME1_1 and RME2_1 may be designed to be differently disposed in order for the light emitting elements ED to be aligned in an obliquely erected state, the light emitting elements ED including first and second light emitting elements ED1 and ED2 that differ in orientation of longitudinal axis. In the following description, a redundant description will be omitted and differences will be described.

The first electrode RME1_1 may be made of the third conductive layer disposed on the second interlayer insulating layer IL2 and located below the hole of the via layer VIA disposed thereon. The first electrode RME1_1 may extend in the second direction DR2 to overlap the hole of the via layer VIA in the thickness direction. In some embodiments, the first electrode RME1_1 may have a width greater than the width DH of the hole of the via layer VIA, but the disclosure is not limited thereto. As the first electrode RME1_1 may be disposed below the hole, an electric field EL for aligning the light emitting elements ED may be generated downward in the hole.

Multiple second electrodes RME2_1 may be disposed for each sub-pixel PXn. The second electrodes RME2_1 may be separated from each other in the first direction DR1 on the via layer VIA and may each extend in the second direction DR2. For example, the second electrodes RME2_1 may be separated from each other across the hole of the via layer VIA in the first direction DR1 and may each be separated from the hole.

In an embodiment, the second electrodes RME2_1 may extend in the second direction DR2 to partially overlap the bank BNL, and may be electrically connected to the first conductive pattern CDP of the third conductive layer through the second contact hole CT2 formed at the portion overlapping the bank BNL. Although it is only shown in the drawing that the second electrode RME2_1 disposed at the upper right side in plan view may be electrically connected to the first conductive pattern CDP, the disclosure is not limited thereto, and the second electrodes RME2_1 may each be electrically connected to the first conductive pattern CDP. Unlike the embodiment of FIG. 3, the second electrodes RME2_1 may be electrically connected to the first conductive pattern CDP rather than the first voltage wiring VL1, and a second contact electrode CNE2_1 to be described later may be electrically connected to the first transistor T1 through the second electrodes RME2_1.

The first contact electrode CNE1_1 may be disposed inside the hole of the via layer VIA, and may be disposed to overlap the first electrode RME1_1 in the thickness direction. The first contact electrode CNE1_1 may be electrically connected to the first electrode RME1_1 through the first contact hole CT1 penetrating the third interlayer insulating layer IL3. According to an embodiment, the first contact electrode CNE1_1 may contact (e.g., directly contact) the first ends of the light emitting elements ED. Since the first electrode RME1_1 may be disposed below the hole, the light emitting elements ED may be aligned such that the first ends thereof may be oriented downward in the hole. The first contact electrode CNE1_1 may be formed before the process of aligning the light emitting elements ED, and the light emitting elements ED may be disposed such that the first ends thereof lie on the first contact electrode CNE1_1. In an embodiment, the first contact electrode CNE1_1 may include a material having high reflectivity such that the lights emitted from the first ends of the light emitting elements ED may be reflected by the first contact electrode CNE1_1. The display device 10_1 may further improve the light emission efficiency of the light emitting elements ED depending on the material of the first contact electrode CNE1_1.

The light emitting elements ED may be disposed such that the second ends thereof may be oriented in the third direction DR3 or a diagonal direction oblique to the third direction DR3 in an erected state inside the hole. The light emitting elements ED may be disposed inside the hole in an oblique state by the electric field EL generated by the first electrode RME1_1 disposed below the hole and the second electrodes RME2_1 arranged to be separated from each other across the hole. In an embodiment, the light emitting elements ED may include the first light emitting element ED1 of which the first end lies on the first contact electrode CNE1_1 and of which a part lies on one side of the inner wall of the hole, and the second light emitting element ED2 of which the first end lies on the first contact electrode CNE1_1 and of which a part lies on the other side of the inner wall of the hole. The display device 10_1 may be manufactured such that the hole of the via layer VIA may be increased in width DH and the light emitting elements ED for each sub-pixel PXn may be increased in number. Even though the width of the hole may be increased, the electrodes RME1_1 and RME2_1 may be designed to be disposed such that the light emitting elements EDs may be aligned in an obliquely erected state inside the holes.

During the process of aligning the light emitting elements ED, an alignment signal may be applied to the first and second electrodes RME1_1 and RME2_1 to generate an electric field EL therebetween. As the display device 10_1 may be manufactured to have the first electrode RME1_1 formed below the hole and the second electrodes RME2_1 separated from each other by the hole, the centers of the electric fields EL being generated between the first and second electrodes RME1_1 and RME2_1 may be located on both sides of the inner wall of the hole.

Figure 12:
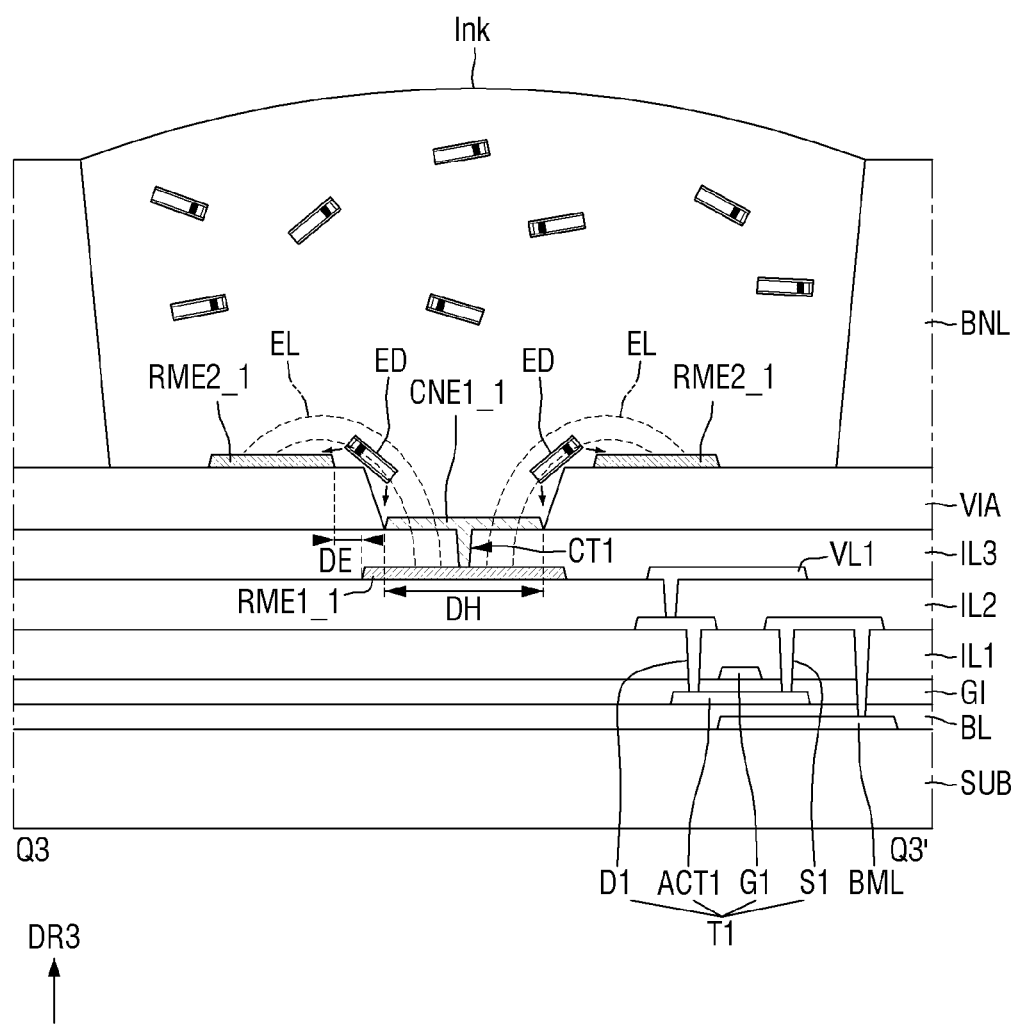
FIG. 12 is a schematic cross-sectional view illustrating an operation of a manufacturing process of the display device of FIG. 10.

FIG. 12 is a schematic cross-sectional view illustrating an operation of a manufacturing process of the display device of FIG. 10.

Referring to FIG. 12 in association with FIGS. 10 and 11, after spraying the ink in which the light emitting elements ED may be dispersed to each sub-pixel PXn, an alignment signal may be applied to the first and second electrodes RME1_1 and RME2_1 to generate an electric field EL inside or around the hole. For example, the first electrode RME1_1 and one of the second electrodes RME2_1, e.g., the second electrode RME2_1 at the left side of the hole, may generate an electric field EL on one side of the inner wall of the hole, and the first electrode RME1_1 and the second electrode RME2_1 at the right side of the hole may generate an electric field EL on the other side of the inner wall of the hole. Particularly, the vertical distance DE between the first electrode RME1_1 and each of the second electrodes RME2_1 may be adjusted such that the centers of the electric fields EL may be located at both sides of the inner wall of the hole. As described above, the light emitting elements ED may change in posture to be oriented to the center of the electric field EL, according to the dielectrophoretic force, and may be disposed such that the opposite ends thereof respectively face the first and second electrodes RME1_1 and RME2_1. The light emitting elements ED may be aligned to lie on the opposite sides of the inner wall of the hole such that the first ends thereof lie on the first contact electrode CNE1_1 disposed inside the hole and the second ends thereof face the second electrodes RME2_1 on the via layer VIA. In the display device 10_1, even though the width of the hole may be increased, the first and second electrodes RME1_1 and RME2_1 may be designed to be disposed such that the light emitting elements ED may be aligned in an obliquely erected state. The display device 10_1 may include more light emitting elements ED to increase the quantity of light emitted by each sub-pixel PXn per unit area.

The light emitting elements ED may be aligned to lie on the opposite sides of the inner wall of the hole, and the first insulating layer PAS1 may be formed to partially surround the light emitting elements ED. The first insulating layer PAS1 may be disposed to fill the hole. The first insulating layer PAS1 may be disposed such that the top surface thereof may be parallel with the via layer VIA, but the disclosure is not limited thereto. The first insulating layer PAS1 may protect the light emitting elements ED and simultaneously fix the light emitting elements ED to prevent the light emitting elements ED from deviating in a subsequent process.

The second contact electrodes CNE2_1 may be arranged to contact the second ends of the light emitting elements ED and the second electrodes RME2_1. The display device 10_1 may include second contact electrodes CNE2_1 according to the second electrode RME2_1 and alignment of the light emitting elements ED. For example, there may be second contact electrode CNE2_1 disposed for each sub-pixel PXn, and each of the second contact electrode CNE2_1 may contact the left one of the second electrodes RME2_1 and the second end of the first light emitting element ED1 or the right one of the second electrodes RME2_1 and the second end of the second light emitting element ED2. The second contact electrodes CNE2_1 may be separated from each other by the hole in the first direction DR1 and partially disposed on the first insulating layer PAS1. The second contact electrodes CNE2_1 may receive the second source voltage from the first transistor T1 through the second electrodes RME2_1 electrically connected to the first conductive pattern CDP.

Although not shown in the drawing, the display device 10_1 may further include an insulating layer interposed between the second contact electrodes CNE2_1 and the second electrodes RME2_1. The insulating layer may protect the second electrodes RME2_1 exposed to the outside and include openings through which the second contact electrodes CNE2_1 and the second electrodes RME2_1 contact each other.

Figure 13:
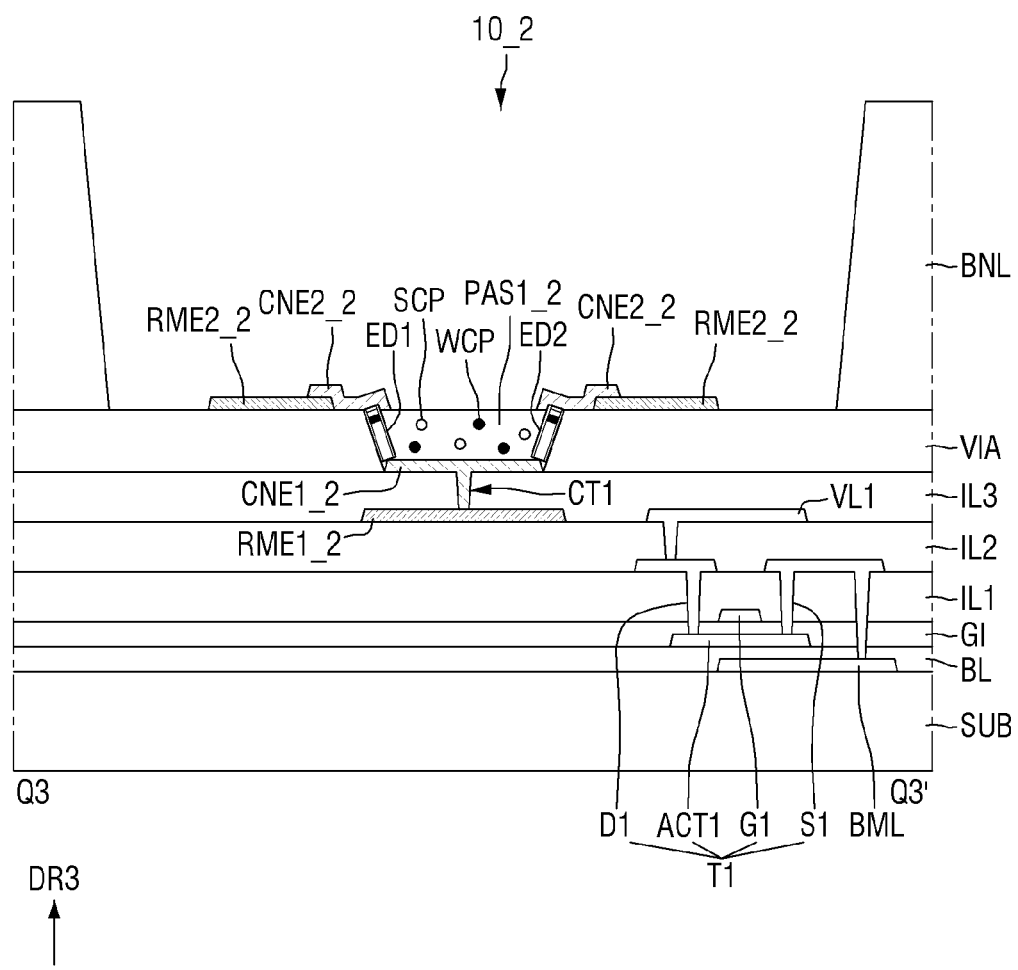
FIG. 13 is a schematic cross-sectional view illustrating a portion of a display device according to still another embodiment.

FIG. 13 is a schematic cross-sectional view illustrating a portion of a display device according to still another embodiment.

Referring to FIG. 13, a display device 10_2 according to this embodiment may further include at least one of scattering particles SCP or wavelength conversion particles WCP disposed in a first insulating layer PAS1_2. The scattering particles SCP may scatter light emitted by the light emitting element ED, and the wavelength conversion particles WCP may convert the wavelength of the light to light of a different wavelength band. The display device 10_2 may adjust the emission direction and color of the light emitted by the light emitting element ED by means of the scattering particles SCP and the wavelength conversion particles WCP included in the first insulating layer PAS1_2. This embodiment differs from the embodiment of FIG. 11 in that the display device 10_2 may further include the scattering particles SCP and the wavelength conversion particles WCP. The first electrode RME1_2, the second electrodes RME2_2, the first contact electrode CNE1_2, and the second contact electrodes CNE2_2 may be identical in arrangement with those described above and thus the following description is made of the differences with the omission of redundancy.

The lights emitted by the light emitting elements ED may be emitted mostly from first and second ends and partially from side surfaces of the light emitting elements ED. The first insulating layer PAS1_2 includes a transparent material such that the light emitted from the side surfaces of the light emitting elements ED may propagate upward away from the first substrate SUB. The scattering particles SCP and the wavelength conversion particles WCP in the first insulating layer PAS1_2 may change the propagation direction and color of the light emitted from the light emitting element ED.

The scattering particles SCP may serve to adjust the propagation path of the light being projected through the first insulating layer PAS1_2. The scattering particles SCP may be metal oxide particles, organic particles, or a combination thereof. Examples of the metal oxide may include titanium oxide ($TiO_2$), zirconium oxide ($ZrO_2$), aluminum oxide ($Al_xO_y$), indium oxide ($In_2O_3$), zinc oxide (ZnO), tin oxide ($SnO_2$), or the like, or a combination thereof. Examples of a material of the organic particles may include acrylic resin, urethane resin, and the like, or a combination thereof.

The wavelength conversion particles WCP may convert the light emitted from the light emitting element ED to a different color light. For example, the light emitting element ED may emit light of a first color, and the wavelength conversion particles WCP may convert the light of the first color to light of a second color or a third color. The wavelength conversion particles WCP may be quantum dots, quantum rods, or fluorescent substances. Examples of the quantum dots may include group IV nanocrystals, group II-VI compound nanocrystals, group III-V compound nanocrystals, group IV-VI nanocrystals, and combinations thereof. The display device 10_2 may be composed of pixels each including first to third sub-pixels PX1, PX2, and PX3 representing different colors. In an embodiment in which the light emitting element ED emits light of the first color and, the first sub-pixel PX1 may represent the first color and the second and third sub-pixels PX2 and PX3 may respectively represent the second and third colors. In the case of the first sub-pixel PX1, the first insulating layer PAS1_2 may include only the scattering particles SCP to adjust the propagation path of the light to be projected through the first insulating layer PAS1_2. In the case of the second and third sub-pixels PX2 and PX3, the first insulating layer PAS1_2 may include both the scattering particles SCP and wavelength conversion particles WCP to adjust the color of the light to be projected through the first insulating layer PAS1_2. Particularly, including both the scattering particles SCP and the wavelength conversion particles WCP in the first insulating layer PAS1_2 may cause the scattering particles SCP to improve the wavelength conversion efficiency.

The display device 10_2 according to this embodiment may allow the sub-pixels PXn to emit different color lights by using the first insulating layer PAS1_2 including at least one of the scattering particles SCP or the wavelength conversion particles WCP even though only the light emitting elements ED emitting the same color light may be included.

Figure 14:
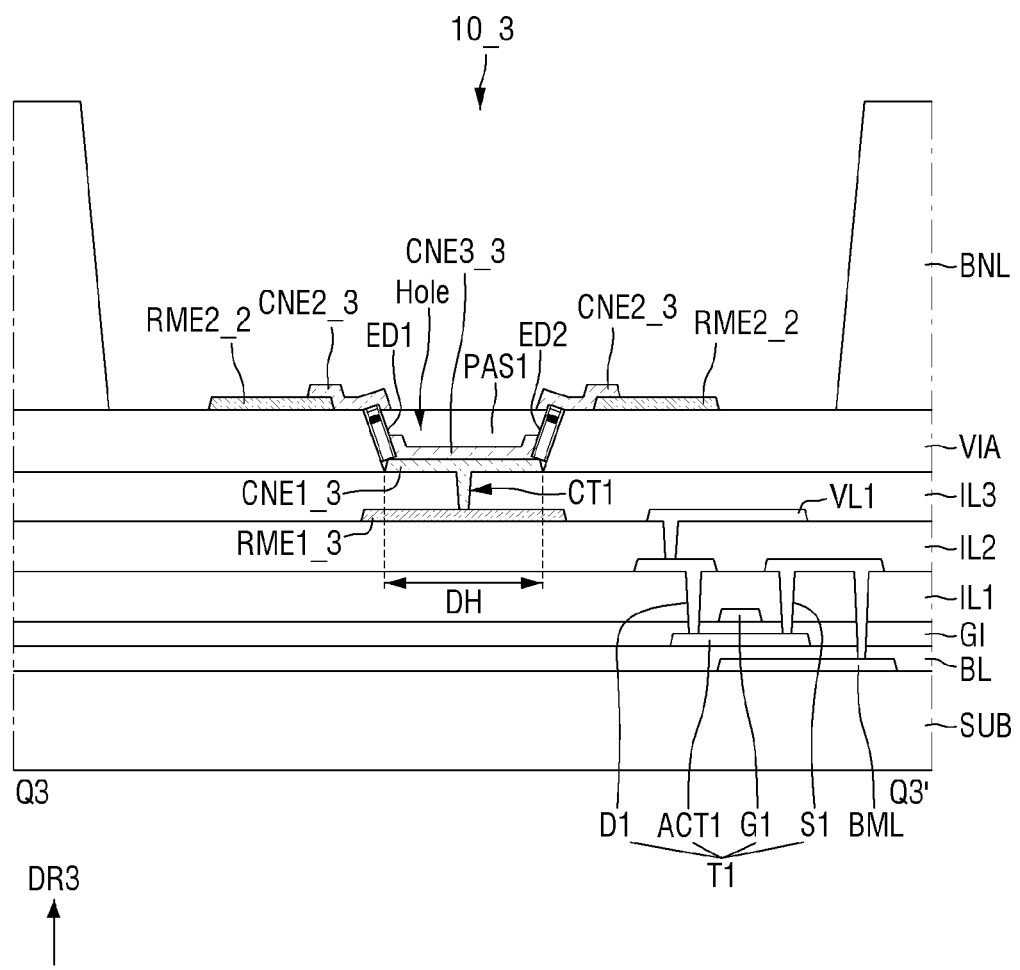
FIG. 14 is a schematic cross-sectional view illustrating a portion of a display device according to still another embodiment.

FIG. 14 is a schematic cross-sectional view illustrating a portion of a display device according to still another embodiment.

Referring to FIG. 14, a display device 10_3 according to this embodiment may further include a third contact electrode CNE3_3 contacting the first ends of the light emitting elements ED1 and ED2 and a first contact electrode CNE1_3. After the first contact electrode CNE1_3 may be formed, the light emitting elements ED1 and ED2 may be aligned by an electric field generated by a first electrode RME1_3 and a second electrode RME2_3 such that the first end thereof lies on the first contact electrode CNE1_3. A second contact electrode CNE2_3 may be formed after the alignment of the light emitting elements ED1 and ED2 to facilitate contact between the second end and the second contact electrode CNE2_3 and to secure a sufficient contact area between the second end and the second contact electrode CNE2_3.

Even though the first ends of the light emitting elements ED1 and ED2 lie on the first contact electrode CNE1_3, it may not facilitate contact between the second end and the second contact electrode CNE2_3 and may fail to secure a sufficient contact area between the second end and the second contact electrode CNE2_3. The display device 10_3 according to this embodiment may further include the third contact electrode CNE3_3 disposed on the first contact electrode CNE1_3 to cover the first ends of the light emitting elements ED1 and ED2 after the light emitting elements ED1 and ED2 may be aligned. The third contact electrode CNE3_3 may be disposed on the first contact electrode CNE1_3 inside the hole and contact the first ends of the light emitting elements ED1 and ED2. Similarly to the second contact electrode CNE2_3, the third contact electrode CNE3_3 may be formed after the light emitting elements ED1 and ED2 may be aligned inside the hole, it may be possible to secure a sufficient contact area for the first ends of the light emitting elements ED1 and ED2.

Since the display device 10_3 may further include the third contact electrode CNE3_3, it may be possible to prevent light emission failure due to disconnection between the light emitting elements ED1 and ED2 and the first contact electrode CNE1_3, which may lead to a reduction in light emission failure rate of the sub-pixel PXn.

Figure 15:
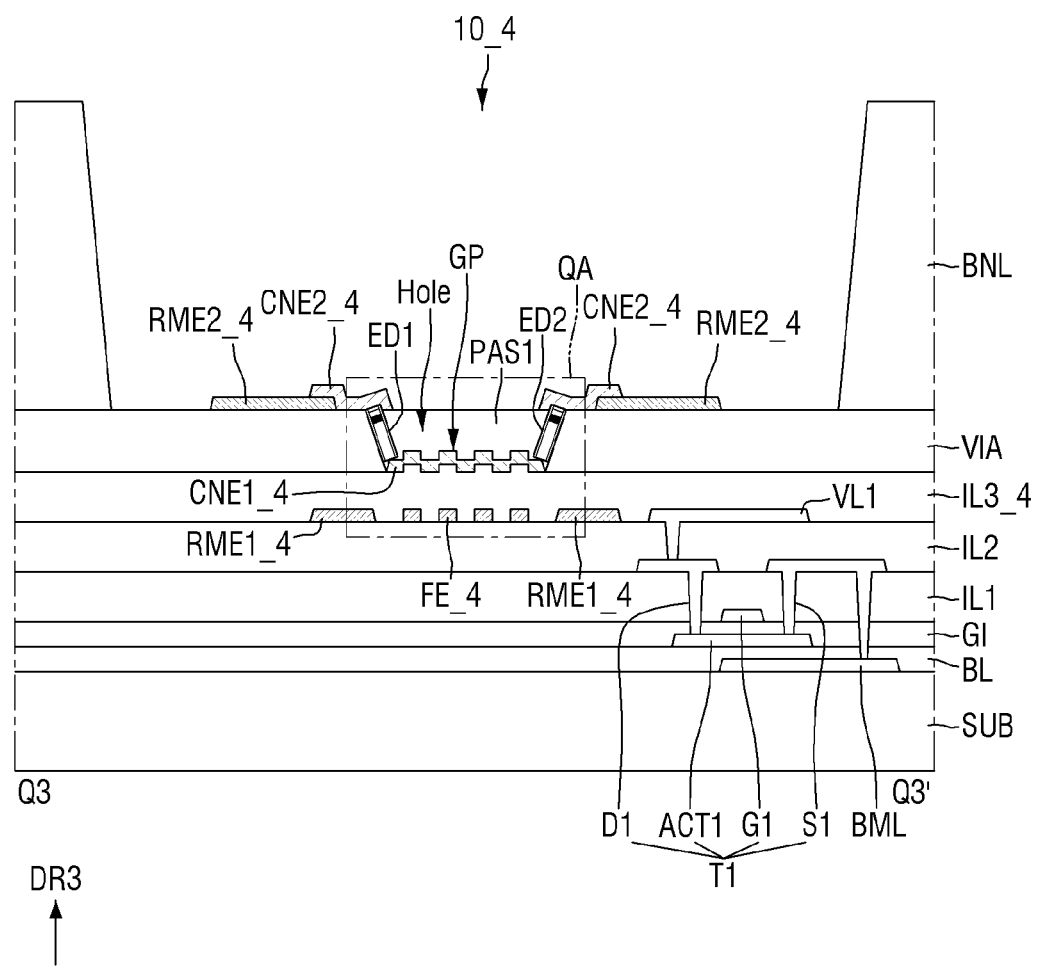
FIG. 15 is a schematic cross-sectional view illustrating a portion of a display device according to another embodiment.
Figure 16:
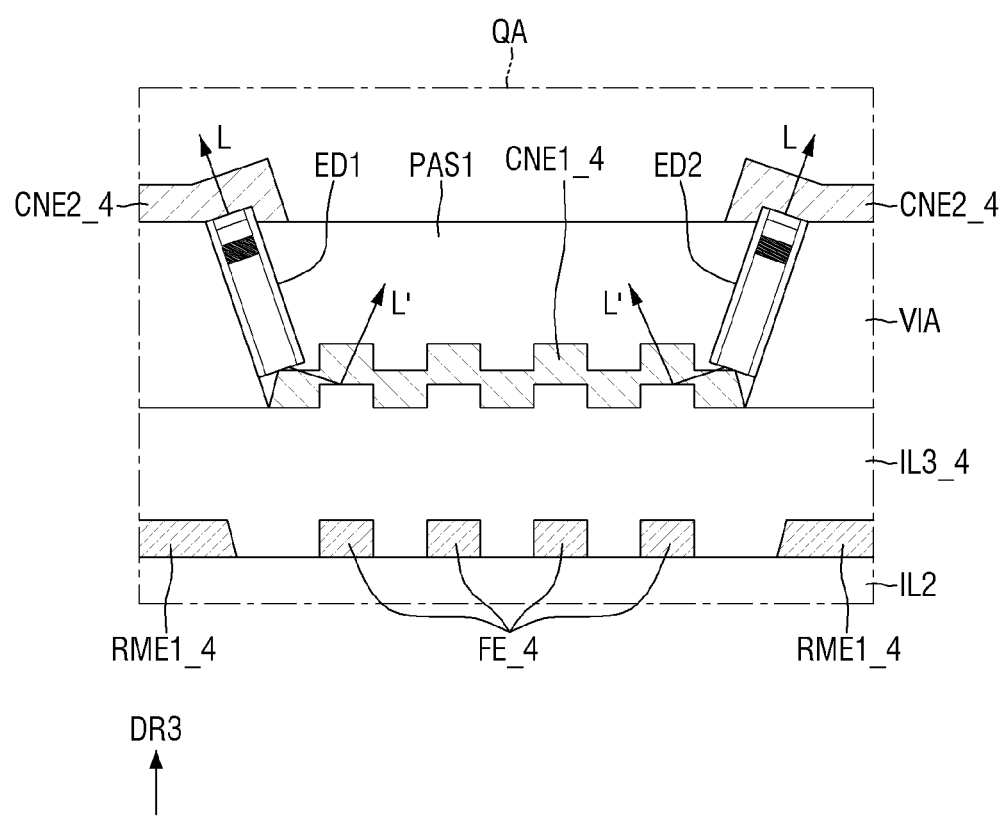
FIG. 16 is a schematic view illustrating propagation of light emitted from a light emitting element of the display device of FIG. 15.

FIG. 15 is a schematic cross-sectional view illustrating a portion of a display device according to another embodiment. FIG. 16 is a schematic view illustrating propagation of light emitted from a light emitting element of the display device of FIG. 15. FIG. 16 is an enlarged view of part QA of FIG. 15, showing propagation directions of lights L and L' emitted from the light emitting elements ED.

Referring to FIGS. 15 and 16, a display device 10_4 according to this embodiment may further include floating electrodes FE_4 disposed on the third conductive layer to overlap the hole in the thickness direction. The display device 10_4 may include a pattern of protrusions of a third interlayer insulating layer IL3_4 covering the third conductive layer, the protrusions corresponding to the floating electrodes FE_4, and a first contact electrode CNE1_4 disposed inside the hole may include a prominence/depression pattern GP formed at a portion covering the pattern of the protrusions. This embodiment differs from the embodiment of FIG. 11 in that the floating electrodes FE_4 disposed on the bottom of the hole may be further included and a first electrode RME1_4 and a first contact electrode CNE1_4 may have different alignments and shapes. In the following description, a redundant description will be omitted and differences will be described.

The floating electrodes FE_4 may be disposed on the third conductive layer to overlap the hole thereabove in the thickness direction. The floating electrodes FE_4 may be relatively narrow in width and arranged to be spaced apart from each other. Although it is exemplarily shown in the drawing that four floating electrodes FE_4 may be disposed, the floating electrodes FE_4 are not limited in number, size, and interval. The floating electrodes FE_4 may be arranged to be connected to neither other wirings nor electrodes, and may affect the shape of the third interlayer insulating layer IL3_4 disposed thereon.

The third interlayer insulating layer IL3_4 may be arranged to cover the third conductive layer and have the top surface of which a part corresponding in area to the pattern of the floating electrodes FE_4 has protrusions corresponding in shape to the floating electrodes FE_4. The top surface of the third interlayer insulating layer IL3_4 may protrude at the positions below which the floating electrodes FE_4 may be disposed and remain at a relatively low height at the positions below which the floating electrodes FE4 may not be disposed. As the floating electrodes FE_4 may be disposed below the hole, the pattern of the protrusions of the top surface of the third interlayer insulating layer IL3_4 may be located inside the hole.

As the floating electrodes FE_4 may be disposed, the first electrode RME1_4 may be arranged not to overlap the hole. In an embodiment, the display device 10_4 may include first electrodes RME1_4 separated from each other across the floating electrodes FE_4. The first electrodes RME1_4 may respectively overlap the second electrodes RME2_4 disposed on the via layer VIA in the thickness direction.

The first contact electrode CNE1_4 may be arranged to cover the pattern of the protrusions of the third interlayer insulating layer IL3_4 inside the hole. In an embodiment, the first contact electrode CNE1_4 may include the prominence/depression pattern GP formed in the area covering the pattern of the protrusions. The first contact electrode CNE1_4 may contact the first ends of the light emitting elements ED and allow the light emitted from the first ends of the light emitting elements ED to pass therethrough.

The light emitting elements ED may have the first and second ends from which light may be emitted, and the lights L emitted from the second ends may penetrate the second contact electrodes CNE2_4 and propagate upward away from the first substrate SUB. The lights L' emitted from the first ends of the light emitting elements ED may propagate toward the top surface of the first substrate SUB and reflected upward by the pattern formed on top surfaces of the first contact electrode CNE1_4 and the third interlayer insulating layer IL3_4.

The floating electrodes FE_4 disposed below the hole may cause the third interlayer insulating layer IL3_4 and the first contact electrode CNE1_4 disposed thereon to form the prominence/depression pattern GP. The lights L' emitted from the first ends of the light emitting elements ED may propagate toward the prominence/depression pattern GP and have a high probability of being reflected on the interface between the first contact electrode CNE1_4 and the third interlayer insulating layer IL3_4 because of the shape of the prominence/depression pattern GP. The incident angle of the lights L' may vary more diversely in the case where the top surface of the first contact electrode CNE1_4 has the prominence/depression pattern GP rather than may be flat, and some of the lights L' may be reflected on the interface with the third interlayer insulating layer IL3_4. The display device 10_4 further including the floating electrodes FE_4 disposed below the hole according to this embodiment may be provided with the prominence/depression pattern GP formed on the top surface of the first contact electrode CNE1_4, which may lead to improvement of light emission efficiency of the light emitting elements ED.

Figure 17:
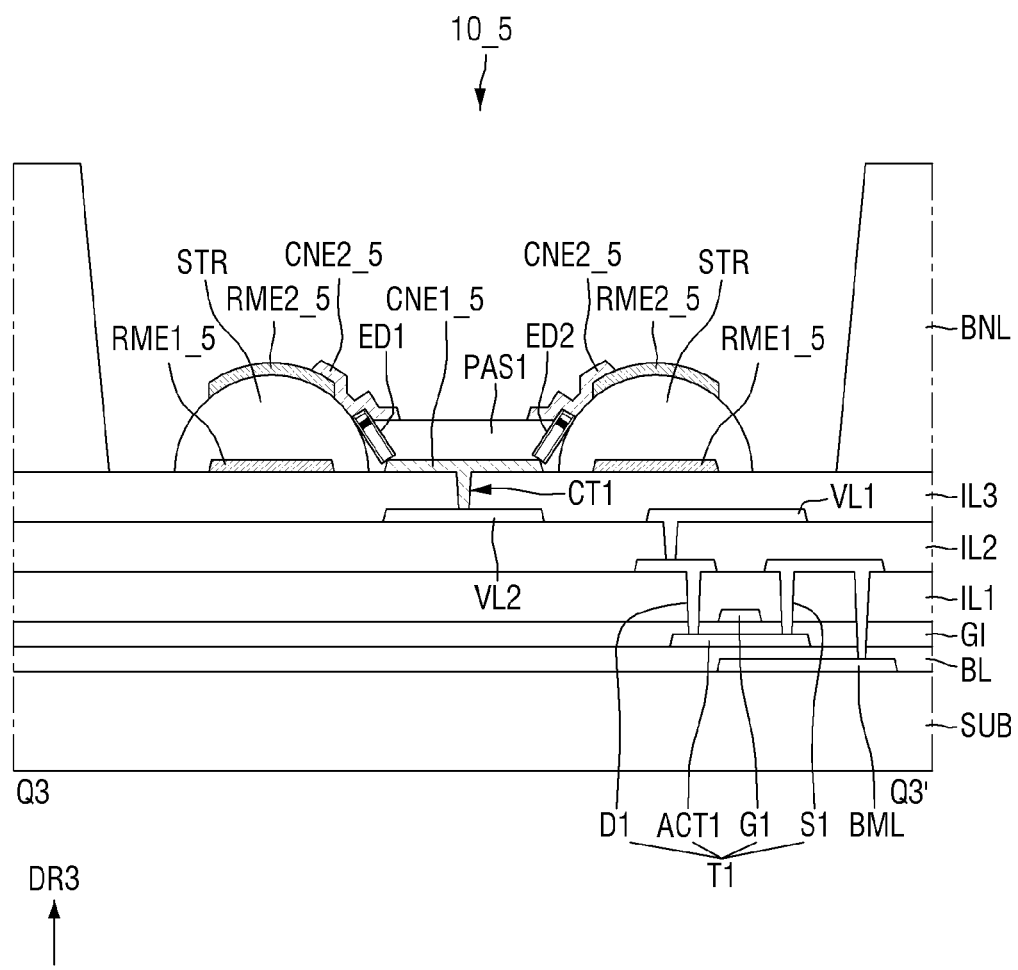
FIG. 17 is a schematic cross-sectional view illustrating a portion of a display device according to still another embodiment.
Figure 18:
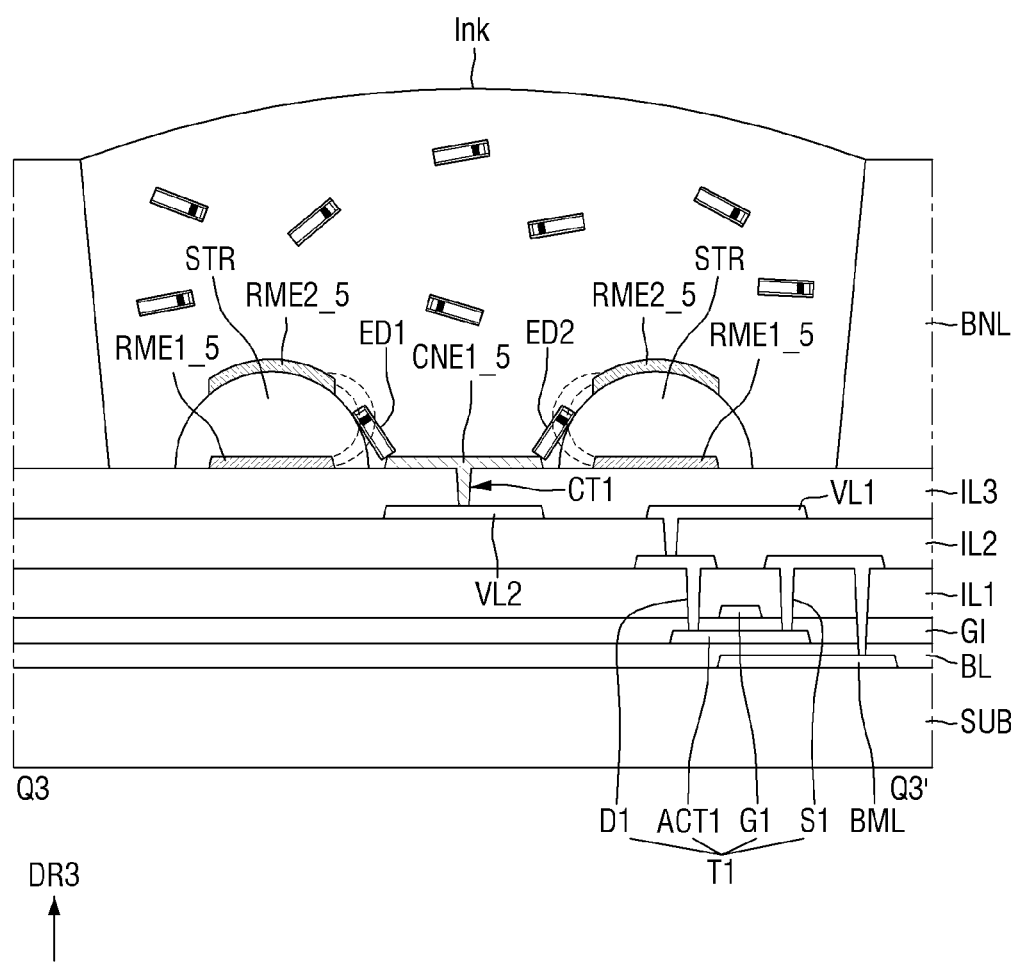
FIG. 18 is a schematic cross-sectional view illustrating an operation in a manufacturing process of the display device of FIG. 17.

FIG. 17 is a schematic cross-sectional view illustrating a portion of a display device according to still another embodiment. FIG. 18 is a schematic cross-sectional view illustrating an operation in a manufacturing process of the display device of FIG. 17. FIG. 18 shows a process of generating an electric field EL for aligning light emitting elements ED during the manufacturing process of a display device 10_5.

Referring to FIGS. 17 and 18, the display device 10_5 according to this embodiment may further include structures STR disposed on the third interlayer insulating layer IL3 with the omission of the via layer VIA. In the display device 10_5, the light emitting elements ED may be aligned in an erected state by using the structures STR rather than the via layer VIA with holes. Electrodes RME1_5 and RME2_5 for aligning the light emitting elements ED may be disposed with the structure STR interposed therebetween, the light emitting elements ED may be arranged to lie on the side surfaces of the structures STR by electric fields EL generated by the electrodes RME1_5 and RME2_5.

The third conductive layer may include a first voltage wiring VL1 and a second voltage wiring VL2. The first voltage wiring VL1 may be electrically connected to the drain electrode D1 of the first transistor T1, and the second voltage wiring VL2 may be arranged to be spaced apart from the first voltage wiring VL1. Similarly to the first electrode RME1 described above, the second voltage wiring VL2 may be a wiring to which the first source voltage for driving the light emitting elements ED may be applied. In this embodiment, the first and second electrodes RME1_5 and RME2_5 to which the alignment signal may be applied may be disposed on the third interlayer insulating layer IL3, and thus the separate second voltage wiring VL2 to which the first source voltage may be applied may be further disposed. The second voltage wiring VL2 may be arranged to overlap a first contact electrode CNE1_5 in the thickness direction and be electrically connected to the first contact electrode CNE1_5.

On the third interlayer insulating layer IL3, the first electrodes RME1_5, the first contact electrode CNE1_5, and the structures STR may be disposed.

The first electrodes RME1_5 may be arranged to be spaced apart from each other. The first electrodes RME1_5 may be arranged to be spaced apart from each other across the first contact electrode CNE1_5 and also spaced apart from the first contact electrode CNE1_5. An alignment signal for aligning the light emitting elements ED may be applied (e.g., directly applied) to the first electrodes RME1_5. As the display device 10_5 further includes the second voltage wiring VL2, the first electrode RME1_5 may not be connected to the wirings below the third interlayer insulating layer IL3 and may be applied with only the alignment signal.

The first contact electrode CNE1_5 may be arranged to overlap the second voltage wiring VL2 in the thickness direction. The first contact electrode CNE1_5 may be disposed between the first electrodes RME1_5 and electrically connected to the second voltage wiring VL2 thereunder through the first contact hole CT1 penetrating the third interlayer insulating layer IL3. The first source voltage applied to the second voltage wiring VL2 may be transmitted to the light emitting elements ED through the first contact electrode CNE1_5.

The structures STR may be arranged to be spaced apart from each other and cover the corresponding first electrodes RME1_5. In an embodiment, the structures STR may be formed to each have a thickness greater than the width of the first electrodes RME1_5 and to be at least partially disposed on (e.g., directly on) the third interlayer insulating layer IL3. However, the structure STR may be adjusted in width to remain distanced from the first contact electrode CNE1_5 disposed between the first electrodes RME1_5.

The structures STR may be formed to protrude at least partially from the top surface of the third interlayer insulating layer IL3. The structures STR may each have an inclined side surface such that the light emitting elements ED lie on the side surface of the structure STR. The structures STR may be arranged to be spaced apart from each other to form a space therebetween for alignment of the light emitting elements ED, which may allow the light emitting elements ED to be aligned in an obliquely erected state. Although it is exemplarily shown in the drawing that the structures STR have a semicircular or semielliptical shape, the disclosure is not limited thereto, and the structures STR may be formed to have linear side surfaces and flat top surfaces. Although the structures STR may include an organic insulating material such as polyimide, the disclosure is not limited thereto.

The bank BNL may be disposed on (e.g., directly disposed on) the third interlayer insulating layer IL3 with the omission of the via layer VIA.

The second electrodes RME2_5 may be disposed on the corresponding structures STR. In an embodiment, the second electrodes RME2_5 may overlap the corresponding first electrodes RME1_5 in the thickness direction. The width of the second electrodes RME2_5 may be substantially equal to the width of the first electrodes RME1_5. However, the disclosure is not limited thereto, and the width of the second electrodes RME2_5 may be adjusted in consideration of the shape and direction of the electric field EL being formed between the first and second electrodes RME1_5 and RME2_5.

The first and second electrodes RME1_5 and RME2_5 may overlap in the third direction DR3, i.e., thickness direction, and may be insulated from each other by the structure STR interposed therebetween, so that different alignment signals may be applied thereto. The alignment signal may be applied to the first and second electrodes RME1_5 and RME2_5 to form an electric field EL oriented in the third direction DR3 therebetween. The light emitting elements ED dispersed in the ink may lie on the side surfaces of the structures STR, changing locations and orientations according to the electric field EL oriented in the third direction DR3.

The light emitting elements ED may be aligned between the structures STR. The light emitting elements ED may be aligned such that one ends thereof lie on the first contact electrode CNE1_5 and the other ends thereof face the second electrodes RME2_5. The first light emitting element ED1 may be aligned to lie on one side surface of the structure STR disposed at the left side, and the second light emitting element ED2 may be aligned to lie on one side surface of the structure STR disposed at the right side. As the structures STR may be formed to have the inclined side surfaces, the light emitting elements ED1 and ED2 may be aligned in an erected state obliquely to the top surface of the first substrate SUB without being parallel thereto.

The first insulating layer PAS1 may be disposed between the structures STR. The first insulating layer PAS1 may be disposed partially cover the light emitting elements ED on the first contact electrodes CNE1_5. The first insulating layer PAS1 may be arranged to partially surround the outer surfaces of the light emitting elements ED to protect the light emitting elements ED and simultaneously fix the light emitting elements ED during the manufacturing process of the display device 10_5.

The second contact electrodes CNE2_5 may be arranged to contact the second ends of the light emitting elements ED and the second electrodes RME2_5. Multiple second contact electrodes CNE2_5 may be disposed for each sub-pixel PXn, and each second contact electrode CNE2_5 may contact the second electrode RME2_5 disposed at the left side, among the second electrodes RME2_5 and the second end of the first light emitting element ED1, or the second electrode RME2_5 disposed at the right side and the second end of the second light emitting element ED2. The second contact electrodes CNE2_5 may be disposed on the corresponding structures STR to be spaced apart from each other, and may be disposed partially on the first insulating layer PAS1.

The display device 10_5 according to this embodiment may include the structures STR disposed on (e.g., directly on) the third interlayer insulating layer IL3 with the omission of the via layer VIA having holes. The display device 10_5 includes the structures STR, instead of the via layer VIA, for aligning the light emitting elements ED in an obliquely erected state, which may cause the second end to face upward away from the first substrate SUB.

Figure 19:
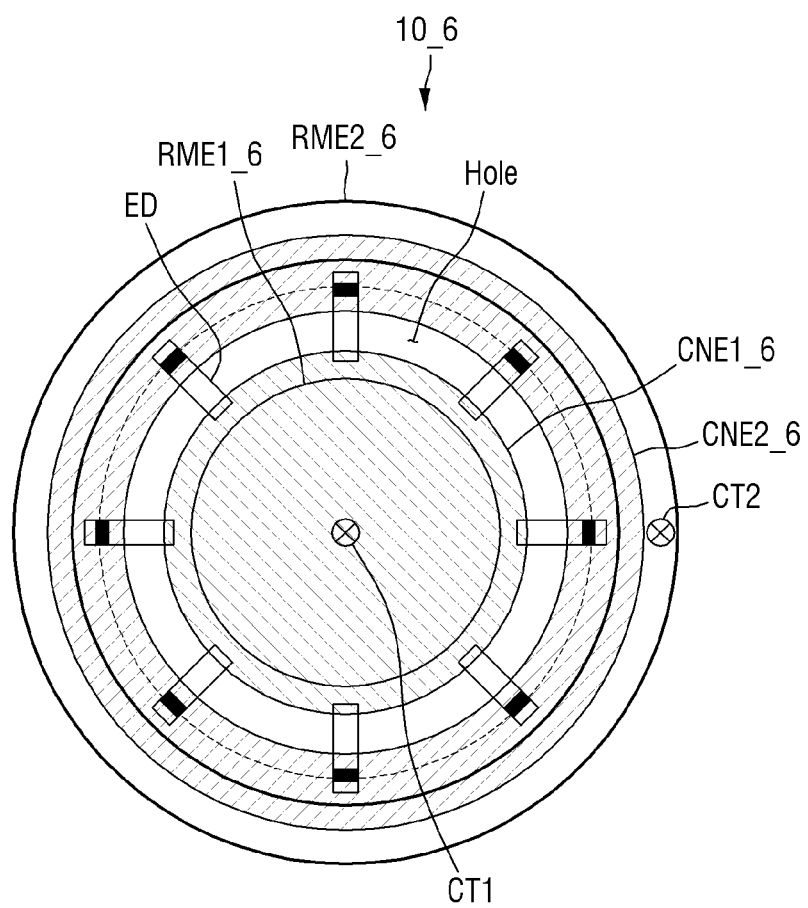
FIG. 19 is a schematic plan view illustrating a sub-pixel of a display device according to still another embodiment.

FIG. 19 is a schematic plan view illustrating a sub-pixel of a display device according to still another embodiment.

Referring to FIG. 19, a display device 10_6 according to this embodiment may be characterized in that the hole of the via layer VIA has a circular shape, and electrodes RME1_6 and RME2_6 and contact electrodes CNE1_6 and CNE2_6 may be structured in circular shapes. The display device 10_6 according to this embodiment differs from the embodiment of FIGS. 10 and 11 in that the hole of the via layer VIA has a circular shape. The cross-sectional structure of the display device 10_6 may be substantially identical with that of FIG. 11 and thus the following description is directed to the shapes of the hole, the electrodes RME1_6 and RME2_6, and the contact electrodes CNE1_6 and CNE2_6 in plan view, omitting redundant descriptions.

The first electrode RME1_6 and the first contact electrode CNE1_6 may be disposed inside the circular hole. The first electrode RME1_6 and the first contact electrode CNE1_6 may have circular shapes and may be arranged to overlap each other in the thickness direction inside the hole. As described above, the first contact electrode CNE1_6 may contact the first electrode RME1_6 through the first contact hole CT1. However, the disclosure is not limited thereto, and the first electrode RME1_6 may be arranged to extend in one direction similarly as in other embodiments.

The second electrode RME2_6 may be arranged to be spaced apart from the hole on the via layer VIA, and the second contact electrode CNE2_6 may be disposed across the outer side of the hole and the second electrode RME2_6. The second electrode RME2_2 may have a predetermined width and may be arranged to be distanced from the outer side of the hole and to surround the outer side of the hole. The second electrode RME2_6 may mostly have a shape of a ring in plan view. The second contact electrode CNE2_6 may have a shape similar to that of the second electrode RME2_6 and may be disposed across the outer side of the hole and the second electrode RME2_6. The second electrode RME2_6 may contact the first conductive pattern CDP through the second contact hole CT2. The second contact electrode CNE2_6 may simultaneously contact the light emitting elements ED aligned inside the hole, i.e., placed on the inner wall of the hole, and the second electrode RME2_6.

The light emitting elements ED may be aligned inside the hole such that the first ends thereof lie on the first contact electrode CNE1_6 in the state of being obliquely placed on the inner wall of the hole. As the hole may be formed to have a circular shape, the light emitting elements ED may be aligned to surround the center of the hole along the inner wall of the hole. The first ends of the light emitting elements ED may contact the first contact electrode CNE1_6, and the second ends thereof may contact the second contact electrode CNE2_6 disposed thereabove. As the display device 10_6 according to this embodiment has the circular hole, the second ends of the light emitting elements ED may face different directions, and the light emission direction of each sub-pixel PXn may be various without limitation.

However, although the hole of the via layer VIA, the electrodes RME1 and RME2, and the contact electrodes CNE1 and CNE2 constituting the display device 10 may be disposed as shown in FIG. 19, they may not have circular shapes. In some embodiments, the hole, the electrodes RME1 and RME2, and the contact electrodes CNE1 and CNE2 may have polygonal shapes, and the second electrode RME2 and the second contact electrode CNE2 may be arranged to cover at least a part of the outer surface of the first electrode RME1 and the first contact electrode CNE1, respectively, in plan view.

Figure 20:
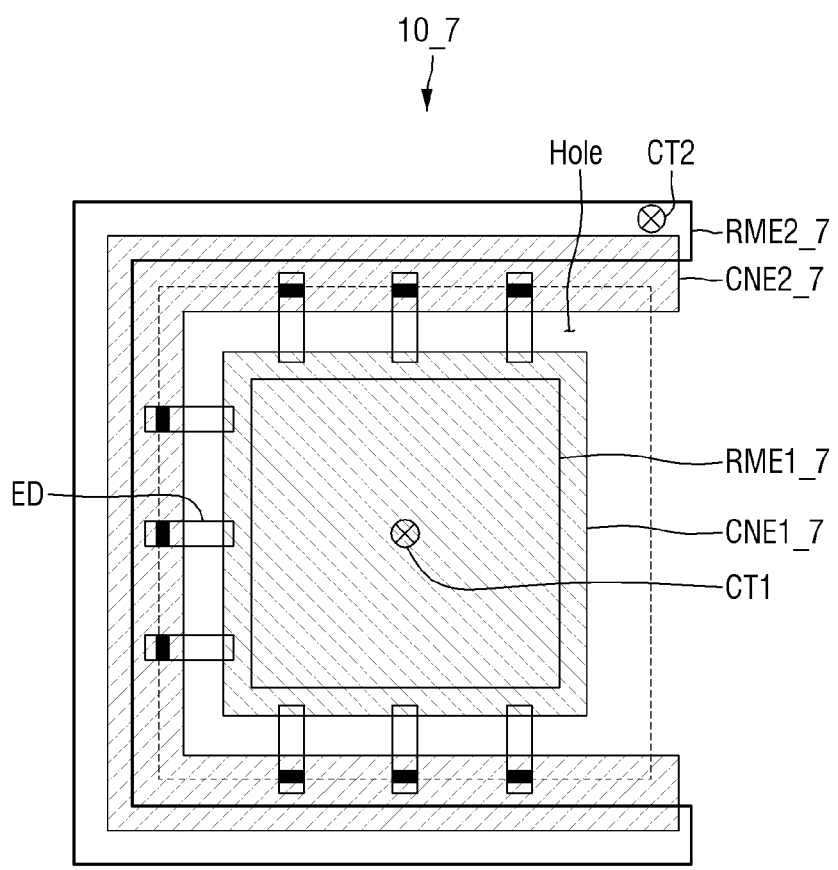
FIG. 20 is a schematic plan view illustrating a sub-pixel of a display device according to still another embodiment.

FIG. 20 is a schematic plan view illustrating a sub-pixel of a display device according to still another embodiment.

Referring to FIG. 20, a display device 10_7 may include a via layer VIA including a hole having a polygonal shape and electrodes RME1_7 and RME2_7 and contact electrodes CNE1_7 and CNE2_7 having angular shapes in structure. The display device 10_7 according to this embodiment differs from the embodiment of FIG. 19 in the shape of the hole of the via layer VIA, and the arrangement structure of the electrodes RME1_7 and RME2_7 and the contact electrodes CNE1_7 and CNE2_7. Hereinafter, descriptions are made of the shapes of the hole, the electrodes RME1_7 and RME2_7 and the contact electrodes CNE1_7 and CNE2_7 in plan view, omitting redundant descriptions.

The first electrode RME1_7 and the first contact electrode CNE1_7 may be disposed inside the hole having a polygonal shape. For example, in an embodiment in which the hole has a quadrilateral shape, the first electrode RME1_7 and the contact electrode CNE1_7 may each have a quadrilateral shape and may be arranged to overlap each other in the thickness direction inside the hole.

The second electrode RME2_7 may be arranged to be distanced from the hole on the via layer VIA, and the second contact electrode CNE2_7 may be disposed across the outer side of the hole and the second electrode RME2_7. The second electrode RME2_7 may have a predetermined width and may be arranged to be distanced from the outer side of the hole and to partially surround the outer side of the hole. For example, in an embodiment in which the hole has a quadrilateral shape, the second electrode RME2_7 may have a shape so as to be distanced from three sides with the exception of one side among the outer sides of the hole in plan view. The second contact electrode CNE2_7 may be similar in shape to the second electrode RME2_7 and may be disposed across the outer side of the hole and the second electrode RME2_7. The second contact electrode CNE2_7 may simultaneously contact the light emitting elements ED aligned inside the hole, i.e., placed on the inner wall of the hole, and the second electrode RME2_7.

The light emitting elements ED may be aligned inside the hole such that the first ends thereof lie on the first contact electrode CNE1_7 in the state of being obliquely placed on the inner wall of the hole. As the hole may be formed to have a polygonal shape, the light emitting elements ED may be aligned to surround the center of the hole along the inner wall of the hole. However, the light emitting elements ED may not be aligned on one side, which may not be arranged to be distanced from the second electrode RME2_7, among the outer sides of the hole. The first ends of the light emitting elements ED may contact the first contact electrode CNE1_7, and the second ends thereof may contact the second contact electrode CNE2_7 disposed thereabove.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
a first substrate;
a conductive layer including a first electrode disposed on the first substrate;
an interlayer insulating layer disposed on the conductive layer;
a via layer disposed on the interlayer insulating layer and including a hole exposing a part of a top surface of the interlayer insulating layer;
a second electrode spaced apart from the hole and disposed on the via layer;
light emitting elements disposed inside the hole of the via layer;
a first contact electrode electrically connected to the first electrode and a first end of the light emitting elements; and
a second contact electrode disposed on the via layer and electrically connected to a second end of the light emitting elements, wherein
at least a part of the light emitting elements are placed on an inner wall of the hole, and
a direction in which a longitudinal axis of the light emitting elements extends is inclined not to be parallel with a top surface of the first substrate.

2. The display device of claim 1, wherein
the second electrode is disposed not to overlap the first electrode in a thickness direction,
the first contact electrode is disposed on the via layer,
at least a part the first contact electrode is disposed on the inner wall of the hole, and
the first contact electrode is electrically connected to the first end of the light emitting elements.

3. The display device of claim 2, further comprising a first insulating layer disposed to overlap a portion of the light emitting elements, the first contact electrode, and the second electrode,
wherein the second contact electrode is disposed directly on the first insulating layer to directly contact the second end of the light emitting elements which stick out from the first insulating layer.

4. The display device of claim 3, wherein the conductive layer includes:

a first voltage wiring disposed to overlap the second electrode in a thickness direction; and
a conductive pattern spaced apart from the first voltage wiring, and
the second electrode is directly connected to the first voltage wiring through a contact hole penetrating the via layer without being connected to the second contact electrode.

5. The display device of claim 4, wherein
the first contact electrode is directly connected to the first electrode through a contact hole penetrating the via layer and the interlayer insulating layer, and
the second contact electrode is directly connected to the conductive pattern through a contact hole penetrating the first insulating layer, the via layer, and the interlayer insulating layer.

6. The display device of claim 2, wherein a width of the hole is smaller than a length of the light emitting elements.

7. The display device of claim 1, wherein
the first electrode is disposed to overlap the hole in a thickness direction,
the first contact electrode is disposed inside the hole to be directly connected to the first electrode, and
the first end of the light emitting elements are disposed on the first contact electrode.

8. The display device of claim 7, wherein
the second electrode is provided in plural such that a plurality of the second electrodes are spaced apart from each other with the hole therebetween, and
each of the second electrodes does not overlap the first electrode in a thickness direction.

9. The display device of claim 8, wherein the light emitting elements include:
a first light emitting element having the second end disposed toward one of the second electrodes and placed on a side of the inner wall of the hole; and
a second light emitting element having the second end disposed toward another one of the second electrodes and placed on another side of the inner wall of the hole.

10. The display device of claim 9, wherein
the second contact electrode is provided in plural such that a plurality of the second contact electrodes are disposed to respectively contact the second electrodes, and
each of the second contact electrodes is in contact with a second end of the first light emitting element and a second end of the second light emitting element.

11. The display device of claim 7, further comprising a first insulating layer disposed to fill the hole and surrounding outer surfaces of the light emitting elements.

12. The display device of claim 11, further comprising wavelength conversion particles and scattering particles disposed in the first insulating layer,
wherein the wavelength conversion particles convert a wavelength of light emitted from the light emitting elements.

13. The display device of claim 1, wherein
the conductive layer includes floating electrodes overlapping the hole in a thickness direction and spaced apart from each other, and
the first electrode is provided in plural such that a plurality of the first electrodes are spaced apart from each other and the floating electrodes are disposed between the first electrodes, and
the first contact electrode is disposed to overlap the floating electrodes in a thickness direction inside the hole.

14. The display device of claim 13, wherein
the interlayer insulating layer includes a pattern of protrusions formed at a portion overlapping the floating electrodes and protruding correspond to the floating electrodes, and
the first contact electrode includes a prominence or depression pattern formed at a portion overlapping the pattern of the protrusions.

15. The display device of claim 13, wherein
the second electrode is provided in plural such that a plurality of the second electrodes are spaced apart from each other and the hole is disposed between the second electrodes, and
each of the second electrodes overlaps the first electrode in a thickness direction.

16. A display device comprising:
a first substrate;
first electrodes disposed on the first substrate and spaced apart from each other;
a first contact electrode disposed between the first electrodes, the first contact electrode and the first electrodes being disposed on a same layer;
structures disposed to respectively overlap the first electrodes;
second electrodes respectively disposed on the structures to overlap the first electrodes in a thickness direction;
light emitting elements disposed between the structures such that first ends of the light emitting elements are disposed on the first contact electrode and second ends of the light emitting elements are disposed on side surfaces of the structures; and
second contact electrodes electrically connected to the second ends of the light emitting elements and the second electrodes,
wherein the light emitting elements are disposed such that a direction in which a longitudinal axis of the light emitting elements extends is inclined not to be parallel with a top surface of the first substrate.

17. The display device of claim 16, wherein
a width of each of the structures is greater than a width of the first electrode, and
the first contact electrode is disposed between the structures.

18. The display device of claim 17, wherein
the light emitting elements include:
a first light emitting element disposed such that the second end is disposed on one of the structures; and
a second light emitting element disposed such that the second end is disposed on another one of the structures, and
the second ends of the first and second light emitting elements face different directions.

19. The display device of claim 18, wherein
the second contact electrodes are spaced apart from each other to contact the second end of the first light emitting element or the second end of the second light emitting element, and
the second contact electrodes directly contact the second electrodes.

20. The display device of claim 17, further comprising a first insulating layer disposed on the first contact electrode between the structures to partially surround outer surfaces of the light emitting elements.

* * * * *